(12) United States Patent
Rappaport et al.

(10) Patent No.: US 7,286,971 B2
(45) Date of Patent: Oct. 23, 2007

(54) SYSTEM AND METHOD FOR EFFICIENTLY VISUALIZING AND COMPARING COMMUNICATION NETWORK SYSTEM PERFORMANCE

(75) Inventors: Theodore Rappaport, Salem, VA (US); Roger Skidmore, Blacksburg, VA (US); Brian Gold, Blacksburg, VA (US)

(73) Assignee: Wireless Valley Communications, Inc., Blackburg, VA (US)

( * ) Notice: Subject to any disclaimer, the term of this patent is extended or adjusted under 35 U.S.C. 154(b) by 425 days.

(21) Appl. No.: 10/956,027

(22) Filed: Oct. 4, 2004

(65) Prior Publication Data

US 2005/0043933 A1  Feb. 24, 2005

Related U.S. Application Data

(62) Division of application No. 09/632,803, filed on Aug. 4, 2000.

(51) Int. Cl.
*G06F 17/50* (2006.01)
*H04Q 7/36* (2006.01)

(52) U.S. Cl. ............... 703/2; 703/18; 703/6; 345/441; 455/500

(58) Field of Classification Search .............. 703/2, 703/6, 5, 18, 20, 21; 345/441; 455/115.1, 455/456.1, 500; 715/736
See application file for complete search history.

(56) References Cited

U.S. PATENT DOCUMENTS

| | | | |
|---|---|---|---|
| 4,675,147 A | 6/1987 | Schaefer et al. |
| 4,736,453 A | 4/1988 | Schloemer |
| 4,885,694 A | 12/1989 | Pray et al. |
| 5,111,392 A | 5/1992 | Malin |
| 5,119,307 A | 6/1992 | Blaha et al. |
| 5,239,487 A | 8/1993 | Horejsi et al. |
| 5,293,640 A | 3/1994 | Gunmar et al. |
| 5,307,261 A | 4/1994 | Maki et al. |
| 5,337,149 A | 8/1994 | Kozah et al. |
| 5,339,184 A | 8/1994 | Tang |
| 5,375,123 A | 12/1994 | Andersson et al. |
| 5,394,522 A | 2/1995 | Sanchez-Frank et al. |
| 5,450,615 A | 9/1995 | Fortune et al. |
| 5,458,123 A | 10/1995 | Unger |
| 5,465,390 A | 11/1995 | Cohen |
| 5,467,441 A | 11/1995 | Stone et al. |
| 5,482,050 A | 1/1996 | Smokoff et al. |
| 5,485,568 A | 1/1996 | Venable et al. |

(Continued)

OTHER PUBLICATIONS

Mende W. et al. "Mobile Radio Network Management Supported by a Planning Tool" vol. 2, No. 15; 1998.

(Continued)

*Primary Examiner*—Thai Phan

(57) ABSTRACT

A method for visualizing and efficiently making comparisons of communication system performance utilizing predicted performance, measured performance, or other performance data sets is described. A system permits visualizing the comparisons of system performance data in three-dimensions using fluctuating elevation, shape, and/or color within a three-dimensional computer drawing database consisting of one or more multi-level buildings, terrain, flora, and additional static and dynamic obstacles (e.g., automobiles, people, filing cabinets, etc.). The method enables a design engineer to visually compare the performance of wireless communication systems as a three-dimensional region of fluctuating elevation, color, or other aesthetic characteristics with fully selectable display parameters, overlaid with the three-dimensional site-specific computer model for which the design was carried out.

32 Claims, 14 Drawing Sheets

U.S. PATENT DOCUMENTS

| | | | |
|---|---|---|---|
| 5,491,644 A | 2/1996 | Pickering et al. | |
| 5,491,837 A | 2/1996 | Haartsen | |
| 5,493,679 A | 2/1996 | Virgil et al. | |
| 5,515,269 A | 5/1996 | Willis et al. | |
| 5,528,518 A | 6/1996 | Bradshaw et al. | |
| 5,539,665 A | 7/1996 | Lamming et al. | |
| 5,553,312 A | 9/1996 | Gattey et al. | |
| 5,553,620 A | 9/1996 | Snider et al. | |
| 5,555,354 A | 9/1996 | Strasnick et al. | |
| 5,561,841 A | 10/1996 | Markus | |
| 5,564,070 A | 10/1996 | Want et al. | |
| 5,586,254 A | 12/1996 | Kondo et al. | |
| 5,594,946 A | 1/1997 | Menich et al. | |
| 5,598,532 A | 1/1997 | Liron | |
| 5,608,854 A * | 3/1997 | Labedz et al. | 345/441 |
| 5,625,827 A | 4/1997 | Krause et al. | |
| 5,636,344 A | 6/1997 | Lewis | |
| 5,689,355 A | 11/1997 | Okubo et al. | |
| 5,710,758 A | 1/1998 | Soliman et al. | |
| 5,755,072 A | 5/1998 | Lingafelter | |
| 5,761,093 A | 6/1998 | Urbish et al. | |
| 5,774,669 A | 6/1998 | George et al. | |
| 5,794,128 A | 8/1998 | Brockel et al. | |
| 5,799,154 A | 8/1998 | Kuriyan | |
| 5,802,146 A | 9/1998 | Dulman | |
| 5,809,282 A | 9/1998 | Cooper et al. | |
| 5,815,395 A | 9/1998 | Hart et al. | |
| 5,821,937 A | 10/1998 | Tonelli et al. | |
| 5,825,759 A | 10/1998 | Liu | |
| 5,828,960 A | 10/1998 | Tang et al. | |
| 5,831,610 A | 11/1998 | Tonelli et al. | |
| 5,832,389 A | 11/1998 | Dent | |
| 5,845,124 A | 12/1998 | Berman | |
| 5,861,887 A | 1/1999 | Butler et al. | |
| 5,867,112 A | 2/1999 | Kost | |
| 5,877,777 A | 3/1999 | Colwell | |
| 5,878,328 A | 3/1999 | Chawla et al. | |
| 5,907,850 A | 5/1999 | Krause et al. | |
| 5,917,808 A | 6/1999 | Kosbab | |
| 5,923,850 A | 7/1999 | Barroux | |
| 5,926,762 A | 7/1999 | Arpee et al. | |
| 5,940,196 A | 8/1999 | Piehler et al. | |
| 5,945,976 A | 8/1999 | Iwamura et al. | |
| 5,948,055 A | 9/1999 | Pulsipher et al. | |
| 5,949,335 A | 9/1999 | Maynard | |
| 5,949,988 A | 9/1999 | Feisullin et al. | |
| 5,953,669 A | 9/1999 | Stratis et al. | |
| 5,963,867 A | 10/1999 | Reynolds et al. | |
| 5,970,406 A | 10/1999 | Komara | |
| 5,977,851 A | 11/1999 | Stancil et al. | |
| 5,987,328 A | 11/1999 | Ephremides et al. | |
| 5,994,984 A | 11/1999 | Stancil et al. | |
| 6,006,021 A | 12/1999 | Tognazzini | |
| 6,018,625 A | 1/2000 | Hayball et al. | |
| 6,021,316 A | 2/2000 | Heiska et al. | |
| 6,032,105 A | 2/2000 | Lee et al. | |
| 6,038,547 A | 3/2000 | Casto | |
| 6,044,273 A | 3/2000 | Tekinay | |
| 6,058,102 A | 5/2000 | Drysdale et al. | |
| 6,058,262 A | 5/2000 | Kawas et al. | |
| 6,059,842 A | 5/2000 | Dumarot et al. | |
| 6,061,722 A | 5/2000 | Lipa et al. | |
| 6,075,541 A | 6/2000 | Maclinovsky | |
| 6,085,335 A | 7/2000 | Djoko et al. | |
| 6,088,522 A | 7/2000 | Lee et al. | |
| 6,097,957 A | 8/2000 | Bonta et al. | |
| 6,104,699 A | 8/2000 | Holender et al. | |
| 6,108,309 A | 8/2000 | Cohoe et al. | |
| 6,111,857 A | 8/2000 | Soliman et al. | |
| 6,122,083 A | 9/2000 | Ohta et al. | |
| 6,148,010 A | 11/2000 | Sutton et al. | |
| 6,199,032 B1 | 3/2001 | Anderson | |
| 6,204,813 B1 | 3/2001 | Wadell et al. | |
| 6,208,833 B1 | 3/2001 | Preschutti et al. | |
| 6,229,540 B1 | 5/2001 | Tonelli et al. | |
| 6,243,772 B1 | 6/2001 | Ghori et al. | |
| 6,253,086 B1 | 6/2001 | Parantainen et al. | |
| 6,275,691 B1 * | 8/2001 | Lee et al. | 455/412.1 |
| 6,285,377 B1 | 9/2001 | Greenbaum et al. | |
| 6,289,203 B1 | 9/2001 | Smith et al. | |
| 6,311,144 B1 | 10/2001 | Abu El Ata | |
| 6,317,599 B1 | 11/2001 | Rappaport et al. | |
| 6,326,987 B2 | 12/2001 | Alexander | |
| 6,330,005 B1 | 12/2001 | Tonelli et al. | |
| 6,337,688 B1 | 1/2002 | Berstis | |
| 6,338,031 B1 | 1/2002 | Lee et al. | |
| 6,356,758 B1 | 3/2002 | Almeida et al. | |
| 6,393,432 B1 | 5/2002 | Flansburg et al. | |
| 6,408,312 B1 | 6/2002 | Forthman et al. | |
| 6,442,507 B1 | 8/2002 | Skidmore et al. | |
| 6,470,195 B1 | 10/2002 | Meyer | |
| 6,487,417 B1 | 11/2002 | Rossoni et al. | |
| 6,493,679 B1 | 12/2002 | Rappaport et al. | |
| 6,496,290 B1 | 12/2002 | Lee | |
| 6,499,006 B1 | 12/2002 | Rappaport et al. | |
| 6,505,045 B1 | 1/2003 | Hills et al. | |

OTHER PUBLICATIONS

1. Article "Building Database Manipulator" Copyright, Jan. 1998; MPRG and Virgina Tech.
2. PCS 97 Track 7; Engineering & Systems Management; T. Rappaport.
3. Propagator; vol. 8, No. 3; Fall 1997.
4. SMT Plus 1.0 User's Manual; R. Skidmore & T. Rappaport; Copyright, Aug. 1996; Virginia Tech.
Software by Andrew titled "RF Planner" dated Jun. 17, 1997.
2. A user guide titled "Andrew Microwave System Planner" dated Jul. 1999.
3. A user guide titled Andrew Antenna System Planner dated Jun. 1999.
From Bird's Eye Real-time Mapping Software dated Jun. 30, 2002.
IEEE Transactions on Antennas and propagation, vol. 46, No. 8, Aug. 1998. "Effect of Terrrain on Path Loss in Urban Enviroments for Wireless Applications" Leonard Piazzi and Henry L. Bertoni.
P. Bahl, V. Padmanabhan, and A. Balachandran, "A Software System for Locating Mobile Users: Design, Evaluation, and Lessons," Microsoft Technical Report, Apr. 2000.
G. Durgin, T.S. Rappaport, H. Xu, Measurements and Models for Radio Path Loss and Penetration Loss in and Around Homes and Trees at 5.85 GHz, IEEE Transactions on Communications, vol. 46, No. 11, Nov. 1998.
C.M. Peter Ho et al., "Antenna Effects on Indoor Obstructed Wireless Channels and a Deterministic Image-Based Wide-Band Propagation Model for In-Building Personal Communications Systems," International Journal of Wireless Information Networks, vol. 1, No. 1, 1994.
S. Kim et al. "Radio Propagation Measurements and Predictions Using Three-dimensional Ray Tracing in Urban Environments at 908 MHZ and 1.9 GHz," IEEE Transactions on Vehicular Technology, vol. 48, No. 3, May 1999.
T.S., Rappaport et al., "Use of Topographic Maps with Building Information to Determine Antenna Placements and GPS Satellite Coverage for Radio Detection and Tracking in Urban Environments," MPRG Technical Report MPRG-TR-95-14, Virginia Tech, Sep. 1995.
R.K. Morrow, Jr. and T.S. Rappaport, "Getting In," Wireless Review Magazine, Mar. 2000.
Wireless Valley Communications, Inc., "SitePlanner 3.16 for Windows 95/98/NT User's Manual," Software User's Manual, pp. 5-148 to 5-156, 1999.

M. Panjwani et al., "Interactive Computation of Coverage Regions for Wireless Communication in Multifloored Indoor Environments." IEEE Journal on Selected Areas in Communications, vol. 14, No. 3, Apr. 1996.

I. Piazzi and H.I. Bertuni, "Achievable Acurracy of Site-Specific Path-Loss Predictions in Residential Environments" IEEE Transactions on Vehicular Technology, vol. 48, No. 3, May 1999.

T.S. Rappaport et al., "Wireless Communications: Past Events and a Future Perspective", IEEE Communications Magazine, May 2002.

T.S. Rappaport et al., "Radio Propagation Prediction Techniques and Computer-Aided Channeling Modeling for Embedded Wireless Microsystems," ARPA Annual Report, MPRG Technical Report MPRG-TR-94-12, Virginia Tech, Jul. 1994.

T.S., Rappaport et al., "Use of Topographic Maps with Building Information to Determine Antenna Placements for Radio Detection and Tracking in Urban Environments," MPRG Technical Report MPRG-TR-95-14, Virginia Tech, Nov. 1995.

D. Ullmo et al., "Wireless Propagation in Buildings: A Statistical Scattering Approach," IEEE Transactions on Vehicular Technology, vol. 48, No. 3, May 1999.

T.S. Rappaport, "wireless Communications: Principles and Practice" Second Edition, Prentice Hall, 2002.

T.S.. Rappaport et al., "Use of Topographic Maps with Building Information to Determine AntennaPlacements and GPS Satellite Coverage for Radio Detection and Tracking in Urban Environments," MPRG Technical Report MPRG-TR-95-14, Virginia Tech, Sep. 1995.

T.S. Rappaport et al., "Indoor Path Loss Measurement for Homes and Apartments at 2.4 and 5.85 GHz," private report produced for Motorola, Dec. 16, 1997.

T.S. Rappaport, "Isolating Interference." Wireless Review Magazine, May 2000.

Slides from T.S. Rappaport and R. Skidmore, "Introduction to In-Building Wireless Systems," Infocast In-Building Wireless Solutions Conference and Exposition, Feb. 4, 2003.

S. Sandha, M.P. Koushik and T.S. Rappaport "Predicted Path Loss for Roslyn VA, First set of predictions for ORD Project on Site Specific Propagation Prediction." MPRG Technical Report MPRG-TR-94-29, Virginia Tech, Dec. 1994.

S. Sandhu, M.P. Koushik, and T.S. Rappaport, "Predicted Path Loss for Roslyn VA.First set of predictions for ORD Project on Site Specific Propagation Prediction." MPRG Technical Report MPRC-TR-94-29 Virginia Tech, Mar. 1993.

S. Seidel et al., "Site-Specific Propagation Prediction for Wireless In-Building Personal Communication Design." IEEE Transactions on Vehicular Technology, vol. 43, No. 4, Nov. 1994.

S. Shakkottai and T.S. Rappaport, "Research Challenges in Wireless Networks: A Technical Overview," Proceeding of the Fifth International Symposium on Wireless Personal Multimedia Communications, Honolulu, HI, Oct. 2002.

H. Sherali et al., "On the Optimal Location of Transmitters for Micro-cellular Radio Communications System Design," IEEE Journal on Selected Areas in Communications, vol. vol. 14, No. 3, pp. 662-673, May 1996.

R. Skidmore et al., "A Comprehensive In-Building and Microcellular Wireless Communication System Design Tool" The Bradley Department of Electrical Engineering, MPRG-TR-97-13, Jun. 1997. Master's Thesis—unpublished by Virginia Tech for 2 years after submission.

R. Skidmore, et al., Russell Senate Office Building Propagation Study, Project Report for Joseph R. Loring & Associates; "Project Update," AoC Contract #Acbr96088, prepared for Office of the Architect of the Capital, Jan. 19, 1997.

R. Skidmore, et al., Russell Senate Office Building Propagation Study, Project Report for Joseph R. Loring & Associates; "Assessment and Study of the Proposed Enhancements of the Wireless Communications Environment of the Russell Senate Office Building (RSOB) and Associated Utility Tunnels," AoC Contract #Acbr96088, prepared for Office of the Architect of the Capitol, Feb. 20, 1997.

R. Torres et al., "CINDOOR: An Engineering Tool for Planning and Design of Wireless Systems in Enclosed Spaces," IEEE Antennas and Propagation Magazine, vol. 41, No. 4, Aug. 1999.

R. Skidmore et al., "Interactive Coverage Region and System Design Simulation for Wireless Communications Systems in Multi-Floored Indoor Environments: SMT Plus *trn*," IEEE ICUPC Proceedings, 1996.

T.S. Rappaport et al., "Radio Propagation Prediction Techniques and Computer-Aided CHannel Modeling for Embedded Wireless Microsystems," MPRG Tech. Report MPRG-TR-95-08, Virginia Tech, Jul. 1995.

Company Web Page "Actix" www.actix.com product name: E-NOS (now E-AMS).

Company Web Page Agilent www.agilent.com product name: OPAS32.

Company Web Page "Agilent" www.agilent.com product name: Wizard.

Company Web Page "Comarco" www.edx.com product name: SignalPro.

Company Web Page "ComOpt" www. comopt.com. product name: Cell Opt AFP.

Company Web Page "Lucent" www.belt-labs.com product name: WISE.

Company Web Page "Ericsson" www.ericsson.com product name: TEMS Lite.

Company Web Page "Ericsson" www.ericsson.com product name: TEMS.

Company Web Page "Marconi" www.marconi.com product name: PlaNET.

Company Web Page "Marconi" www.marconi.com product name: decibelPlanner.

Company Web Page "Schema"www.schema.com product name: Optimizer.

Company Web Page "ScoreBoard" www.scoreboard.com product name: ScoreBoard.

Company Web Page "Actix" www.actix.com product name E-NOS (now E-AMS), No Data find.

Company Web Page Agilent www.agilent.com product name: OPAS32, No Data find.

Company Web Page "Agilent" www.agilent.com product name: Wizard, No Data find.

Company Web Page "Comarco" www.edx.com product name: SignalPro, No Data find.

Company Web Page "ComOpt" www. comopt.com product name: CellOpt AFP, No Data find.

Company Web Page "Lucent" www.bell-labs.com product name: WISE, No Data find.

Company Web Page "Ericsson" www.ericsson.com product name: TEMS Lite, No Data find.

Company Web Page "Ericsson" www.ericsson.com product name: TEMS, No Data find.

Company Web Page "Marconi" www.marconi.com product name: PlaNET, No Data find.

Company Web Page "Marconi" www.marconi.com product name: decibelPlanner, No Data find.

Company Web Page "Schema"www.schema.com product name: Optimizer, No Data find.

Company Web Page "ScoreBoard" www.scoreboard.com product name: ScoreBoard, No Data find.

* cited by examiner

SYSTEM AND METHOD FOR EFFICIENTLY VISUALIZING AND COMPARING COMMUNICATION NETWORK SYSTEM PERFORMANCE

CROSS-REFERENCE TO RELATED APPLICATIONS

This application is related to the U.S. patent application Ser. No. 09/352,679 filed Jul. 14, 1999; U.S. Ser. No. 09/318,840 filed May 26, 1999; U.S. Ser. No. 09/318,841 filed May 26, 1999; U.S. Ser. No. 09/221,985 filed December 29, 1998, and U.S. Ser. No. 09/318,842 filed May 26, 1999; and is also related to the concurrently filed applications having U.S. Ser. No. 09/633,121, entitled "Method and System for Designing and Deploying a Communications Network which Consider Frequency Dependent Effects" now issued as U.S. Pat. No. 6,625,454; and 09/632,853, entitled "Method and system for Designing a Communications Network which Considers Component Attributes" and U.S. Ser. No. 09/633,122, entitled "Method and System for Designing a Communications Network which Allows the Simultaneous Selection of Multiple Components", all of which are assigned to a common assignee, and the subject matter of these applications is incorporated herein by reference. This application is a divisional application of U.S. Ser. No. 09/632,803, filed Aug. 4, 2000, the complete contents of which are incorporated by reference.

BACKGROUND OF THE INVENTION

1. Field of the Invention

The present invention generally relates to engineering and management systems for the design of wireless and wired communication systems and, more particularly, to a method for comparing the performance of wireless and wired systems in any environment (e.g., buildings, floors within a building, campuses, within cities, an outdoor setting, etc.) using a three-dimensional (3-D) visualization method.

2. Description of the Prior Art

As communication systems proliferate, radio frequency (RF) coverage within and around buildings, and radio signal penetration into and out of buildings, has become a critical design issue for communications engineers who must design and deploy cellular telephone systems, paging systems, or new wireless technologies such as personal communication systems (PCS), wireless local area networks (WLAN), and local multi-point distribution systems (LMDS). Emerging hand-held appliances will increasingly use wireless access methods, necessitating the need for tools and methods that allow technicians and engineers to rapidly install such wireless infrastructure. Also, the fiber optic and baseband networks needed to carry internet traffic will proliferate rapidly in the future, as well. In addition, RF networks involving micromachinery, RF identification tags, and optical communication links are of increasing interest due to the rapid miniaturization of communication devices and sensors, and the rapid proliferation of fiber optic bandwidth in and around campuses. Designers are frequently requested to determine if a radio transceiver location or base station cell site can provide adequate, reliable service throughout a room, a building, an entire city, a campus, a shopping mall, or any other environment. The costs of in-building and microcellular wireless communication devices are diminishing while the workload for wireless system design engineers and technicians to deploy such systems is increasing sharply.

Given these factors, rapid engineering design and deployment methods accompanied by comprehensive system performance visualization and analysis methods are vital to wireless communication system designers.

In addition, recent research efforts by AT&T Laboratories, Brooklyn Polytechnic, and Virginia Tech are described in papers and technical reports entitled: S. Kim, B. J. Guarino, Jr., T. M. Willis III, V. Erceg, S. J. Fortune, R. A. Valenzuela, L. W. Thomas, J. Ling, and J. D. Moore, "Radio Propagation Measurements and Predictions Using Three-dimensional Ray Tracing in Urban Environments at 908 MHZ and 1.9 GHz," IEEE Transactions on Vehicular Technology, vol. 48, no. 3, May 1999 (hereinafter "Radio Propagation"); L. Piazzi, H. L. Bertoni, "Achievable Accuracy of Site-Specific Path-Loss Predictions in Residential Environments," IEEE Transactions on Vehicular Technology, vol. 48, no. 3, May 1999 (hereinafter "Site-Specific"); G. Durgin, T. S. Rappaport, H. Xu, "Measurements and Models for Radio Path Loss and Penetration Loss In and Around Homes and Trees at 5.85 GHz," IEEE Transactions on Communications, vol. 46, no. 11, November 1998; T. S. Rappaport, M. P. Koushik, J. C. Liberti, C. Pendyala, and T. P. Subramanian, "Radio Propagation Prediction Techniques and Computer-Aided Channel Modeling for Embedded Wireless Microsystems," ARPA Annual Report, MPRG Technical Report MPRG-TR-94-12, Virginia Tech, July 1994; T. S. Rappaport, M. P. Koushik, C. Carter, and M. Ahmed, "Radio Propagation Prediction Techniques and Computer-Aided Channel Modeling for Embedded Wireless Microsystems," MPRG Technical Report MPRG-TR-95-08, Virginia Tech, July 1994; T. S. Rappaport, M. P. Koushik, M. Ahmed, C. Carter, B. Newhall, and N. Zhang, "Use of Topographic Maps with Building Information to Determine Antenna Placements and GPS Satellite Coverage for Radio Detection and Tracking in Urban Environments," MPRG Technical Report MPRG-TR-95-14, Virginia Tech, September 1995; T. S. Rappaport, M. P. Koushik, M. Ahmed, C. Carter, B. Newhall, R. Skidmore, and N. Zhang, "Use of Topographic Maps with Building Information to Determine Antenna Placement for Radio Detection and Tracking in Urban Environments," MPRG Technical Report MPRG-TR-95-19, Virginia Tech, November 1995; and S. Sandhu, M. P. Koushik, and T. S. Rappaport, "Predicted Path Loss for Rosslyn, Va., Second set of predictions for ORD Project on Site Specific Propagation Prediction," MPRG Technical Report MPRG-TR-95-03, Virginia Tech, March 1995.

The papers and technical reports are illustrative of the state-of-the-art in site-specific radio wave propagation modeling. While most of the above papers describe a comparison of measured versus predicted RF signal coverage and present tabular or two dimensional (2-D) methods for representing and displaying predicted data, they do not report a comprehensive method for visualizing and analyzing wireless system performance. The "Radio Propagation" and "Site-Specific" papers make reference to 3-D modeling, but do not offer novel display methods or graphical techniques to enable a user to visualize signal coverage or interference in 3-D. Furthermore, there do not exist effective methods that allow a wireless communications technician or designer to rapidly display predicted performance values, or to compare, through visualization, differences in predicted performance values between alternate network design concepts within a particular specified environment.

Common to all wireless communication system designs as well as wired network designs is the desire to maximize the performance and reliability of the system while minimizing the deployment costs. Ways to minimize cost include the use of computer aided design tools that manage many aspects of the design process. Such tools also help create methods that enable the engineer or technician to work quickly. Consider a wireless system, for example. Analyzing radio signal coverage and interference is of critical importance for a number of reasons. A design engineer must determine if an environment that is a candidate for a wireless system contains too much noise or interference, or if the existing wireless system will provide sufficient signal power throughout the desired service area. Alternatively, wireless engineers must determine whether local area coverage will be adequately supplemented by existing large scale outdoor wireless systems, or macrocells, or whether indoor wireless transceivers, or picocells, must be added. The placement of these cells is critical from both a cost and performance standpoint. The design engineer must predict how much interference can be expected from other wireless systems and where it will manifest itself within the environment. Prediction methods which are known to the inventors and which are available in the literature provide well accepted methods for computing coverage or interference values for many cases. However, the implementation of such models are generally very crude, and rely on cumbersome spreadsheets, or inefficient operating platforms in research laboratories with little support and little visualization capability. Inevitably, performance measurements must be made in the environment of interest in order to generate the proper prediction models, or to at least verify the chosen prediction models for acceptable accuracy or reliability.

Depending upon the design goals, the performance of a wireless communication system may involve a combination of one or more factors. For example, the total area covered in adequate received signal strength (RSSI), the area covered in adequate data throughput levels, and the number of customers that can be serviced by the system are among the deciding factors used by design engineers in planning the placement of communication equipment comprising the wireless system. Thus, maximizing the performance of a wireless system may involve the complex analysis of multiple, potentially unrelated factors. The ability to display the results of such analysis in a manner easily interpretable by design engineers is invaluable in wireless system deployment. Three dimensional (3-D) visualization of wireless system operating parameters provides the user with rapid assimilation of large data sets and their relation to the physical environment. As wireless systems proliferate, these issues must be resolved quickly, easily, and inexpensively, in a systematic and repeatable manner.

There are many computer aided design (CAD) products on the market that can be used to design a computerized model of an enviromment. WiSE™ from Lucent Technology, Inc., SignalPro™ from EDX, PLAnet™ by Mobile Systems International, Inc., (later known as Metapath Software International, now part of Marconi, P.L.C.) and TEMS from Ericsson, Wizard by Safco Technologies, Inc. (now part of Agilent Technologies, Inc.), are examples of CAD products developed to aid in the design of wireless communication systems.

Lucent Technology, Inc., offers WiSE™ as a design tool for wireless communication systems. The WiSE system predicts the performance of wireless communication systems based on a computer model of a given environment using a deterministic radio coverage predictive technique known as ray tracing.

EDX offers SignalPro® as a design tool for wireless communication systems. The SignalPro system predicts the performance of wireless communication systems based on a computer model of a given environment using a deterministic RF power predictive technique known as ray tracing.

Mobile Systems International, Inc., (now a part of Marconi, P.L.C.), offers PLAnet™ as a design tool for wireless communication systems. The PLAnet system predicts the performance of macrocellular wireless communication systems based upon a computer model of a given environment using statistical and empirical predictive techniques. Ericsson Radio Quality Information Systems offers TEMS™ as a design and verification tool for wireless communication indoor coverage. The TEMS system predicts the performance of indoor wireless communication systems based on a building map with input base transceiver locations and using empirical radio coverage models. The above-mentioned design tools have aided wireless system designers by providing facilities for predicting the performance of wireless communication systems and displaying the results in the form of flat, two-dimensional grids of color or flat, two-dimensional contour regions. Such displays, although useful, are limited by their two-dimensional nature in conveying all nuances of the wireless system performance. For example, slight variations in color present in a two-dimensional grid of color, which may represent changes in wireless system performance that need to be accounted for, may be easily overlooked. Furthermore, as wireless systems proliferate, the ability to visually predict and design for coverage and interference is of increasing value.

Common to all communication system designs, regardless of technology, size or scale, is the need for measurement data at some point in the design process. For environments which are candidates for wireless communication systems, it is essential to first conduct a measurement campaign to determine spectral occupancy, noise levels, interference levels, or available channels.

Whether in the initial design stage or the final verification stage, or during ongoing maintenance during the lifecycle of a communication system, no communication system is implemented without the input and use of measurement data. However, measurement acquisition within in-building environments is much more tedious and time consuming than in the macrocellular environment where measurement acquisition is carried out using Global Positioning System data to determine the location of the measurement being taken. Global Positioning System (GPS) data, which so many RF engineers have come to rely upon for outdoor measurement acquisition, is not an option for microcell environments in most cases, and is extremely difficult to use reliably within buildings, due to the clutter and resulting attenuation of the GPS satellite signal levels within urban areas and within manmade structures. While new methods, such as the Qualcomm SnapTrack indoor GPS system may offer long-term promise for in-building location, today's readily available GPS solutions are expensive and are seldom available to engineers or technicians tasked with the deployment, measurement, or optimization of in-building or microcell networks. Therefore, recording real-time measurement data within a building becomes a laborious, time-consuming task involving scratched notes and blueprints and manual data entry which are both expensive and ineffectual in many respects.

In addition to measuring RF signal properties from emitted base transceivers there is also a need to measure data throughput time in computer data networks. Throughput time is the time required to transfer a record or file of known size from one computer to another. In order to standardize the measurement of data throughput time for comparison or verification purposes, files of a set size (e.g., 100K) are used and transferred in packet sizes such as 512 bytes. Similar to RF signal attenuation, data throughput time, and each of a many number of other important network measurement parameters, such as packet latency, bit error rate, packet error rate, and bit rate throughput, is also a function of transmission distance and signal obstruction (e.g. walls, doors, partitions), as well as multipath propagation and the specific radio modem design.

Presently, there are no known effective visualization techniques that allow an engineer or wireless technician to display measurement results or rapidly compare, through visualization, various measurement results of various performance measurements of a particular communication network, or collection of networks, within a particular specified environment over time, frequency, or space. Various signal property measurement acquisition tools and systems have been developed to aid in the design of wireless communication systems such as PenCat™, Walkabout PCS™ and TEMS Light.

LCC International Inc. offers the PenCat™ as a pen-based collection and analysis tool for wireless communication design that runs on a small hand-held tablet computer. The PenCat™ system enables a user to roam about a building, take signal property measurement data at a location in the building using a receiver linked to the tablet computer, and link the measured data to that building location on a computer map representing the building by tapping the appropriate portion of the map on the computer screen with a stylus pen. The building map can be entered into the PenCat™ system by either scanning blueprints, sketching the building within the application, or importing from another source. PenCAT uses two dimensional bit maps to model the building environment. Safco Technologies, Inc. (now part of Agilent Technologies, Inc.) offers the Walkabout PCS™ system as a portable survey coverage system for use in indoor or outdoor wireless communication system design. Similar to PenCat™, the Walkabout PCS™ system utilizes a hand-held computer linked to a receiver for measuring signal properties at a given location and linking the measured property data to that location represented on a stored computer map. Also similar to the Safco Walkabout is the Agilent 74XX indoor measurement system, which also uses a bitmap floor plan. Ericsson Radio Quality Information Systems offers the TEMS Light system as a verification tool for wireless communication indoor coverage. The TEMS Light system utilizes a Windows-based graphical interface with two dimensional bit map drawings on a mobile computer linked to a receiver to allow a user to view a stored building map, make location specific data measurements, and link the measured data to the represented location on the stored computer map. Unlike other in-building communication measurement systems, InFielder™ by Wireless Valley Communications, Inc. merges measurement data with periodic updates of position location on a three-dimensional model of the physical environment. The InFielder™ product concept is disclosed in U.S. patent application Ser. No. 09/221,985 filed Dec. 29, 1998, and the contents of this application are herein incorporated by reference. However, as originally disclosed in the aforementioned patent application, InFielder, does not offer an efficient method for rapidly viewing and comparing measurement data in a 3-D environment such that measurement values, and comparisons of measurement values, may be quickly determined and inferred by the user.

SUMMARY OF THE INVENTION

It is therefore an object of the present invention to facilitate the display of predicted performance results and the display of comparisons between predicted performance results for wireless or wired communication systems.

It is another object of the present invention to provide a mechanism for displaying predicted performance results and displaying the comparisons between predicted performance results for wireless or wired communication systems.

It is another object of the present invention to facilitate the three-dimensional, multi-colored display of predicted performance results and comparisons between predicted performance results for any type of wireless or wired communication system.

It is another object of the present invention to provide a mechanism for viewing a three-dimensional display of predicted performance results and comparisons between predicted performance results from any angle, orientation, distance, or perspective.

It is another object of the present invention to provide a mechanism for viewing a three-dimensional display of predicted performance results and comparisons between predicted performance results and interacting with the display in real-time to alter the current viewpoint and perspective.

It is another object of the present invention to provide said display of predicted performance results and comparisons between predicted performance results overlaid on a three-dimensional database that may involve a plurality of building structures and the surrounding terrain, flora, climatic conditions, and additional static and dynamic obstacles (e.g., automobiles, people, filing cabinets, etc.).

It is another object of the present invention to provide a mechanism for coloring, shading, and otherwise rendering a solid representation of said three-dimensional display utilizing multiple colors and transparency effects.

In addition to the above, it is yet another object of the present invention to facilitate the display of measurements and the display of comparisons between measured performance results for wireless or wired communication systems.

It is another object of the present invention to provide a mechanism for displaying measurements and displaying the comparisons between measured performance results for wireless or wired communication systems.

It is another object of the present invention to facilitate the three-dimensional, multi-colored display of measurements as well as comparisons between measured performance results for any type of wireless or wired communication system.

It is another object of the present invention to provide a mechanism for viewing a three-dimensional display of measurements as well as comparisons between measured performance results from any angle, orientation, distance, or perspective.

It is another object of the present invention to provide a mechanism for viewing a three-dimensional display of measurements as well as comparisons between measured performance results and interacting with the display in real-time to alter the current viewpoint and perspective.

It is another object of the present invention to provide said display of measurement performance results as well as said display of comparisons between measured performance results overlaid on a three-dimensional database that may involve a plurality of building structures and the surrounding terrain, flora, climatic conditions, and additional static and dynamic obstacles (e.g., automobiles, people, filing cabinets, etc.).

It is another object of the present invention to provide a mechanism for coloring, shading, and otherwise rendering a solid representation of said three-dimensional display utilizing multiple colors and transparency effects.

In addition to the above, it is yet another object of the present invention to facilitate the comparisons between predicted and measured performance results for wireless or wired communication systems.

It is another object of the present invention to provide a mechanism for displaying the comparisons between predicted and measured performance results for wireless or wired communication systems.

It is another object of the present invention to facilitate the three-dimensional, multi-colored display of comparisons between predicted and measured performance results for any type of wireless or wired communication system.

It is another object of the present invention to provide a mechanism for viewing a three-dimensional display of comparisons between predicted and measured performance results from any angle, orientation, distance, or perspective.

It is another object of the present invention to provide a mechanism for viewing a three-dimensional display of comparisons between predicted and measured performance results and interacting with the display in real-time to alter the current viewpoint and perspective.

It is another object of the present invention to provide said display of comparisons between predicted and measured performance results overlaid on a three-dimensional database that may involve a plurality of building structures and the surrounding terrain, flora, climatic conditions, and additional static and dynamic obstacles (e.g., automobiles, people, filing cabinets, etc.).

It is another object of the present invention to provide a mechanism for coloring, shading, and otherwise rendering a solid representation of said three-dimensional display utilizing multiple colors and transparency effects.

According to the present invention, a system is provided for allowing a RF system designer or a communication network designer to dynamically model a wired or wireless system electronically in any environment. The method includes the selection and placement of models of various wireless or optical or baseband communication system hardware components, such as antennas (point, omnidirectional, directional, leaky feeder, distributed, etc.), base stations, base station controllers, transceivers, amplifiers, cables, splitters, attenuators, repeaters, wireless access points, couplers, connectors, connection boxes, splicers, switches, routers, hubs, transducers, translators (such as devices which convert between RF and optical frequencies, or which convert between RF and baseband frequencies, or which convert between baseband and optical frequencies, and devices which translate energy from one part of the electromagnetic spectrum to another), power cables, twisted pair cables, optical fiber cables, and the like, and allows the user to visualize, in three-dimensions, the effects of their placement and movement on overall system performance throughout the modeled environment. Thus, the placement of components can be refined and fine-tuned prior to actual implementation of a system or network, wherein performance prediction modeling or measurement may be used for design and deployment; and to ensure that all required regions of the desired service area are blanketed with adequate connectivity, RF coverage, data throughput, or possess other required network system performance values, such as acceptable levels of quality of service (QoS), packet error rate, packet throughput, packet latency, bit error rate, signal-to-noise ratio (SNR), carrier-to-noise ratio (CNR), signal strength or RSSI, rms delay spread, distortion, and other commonly used communication network performance metrics, known now or in the future, which may be measured or predicted and which may be useful for aiding an engineer in the proper installation, design, or maintenance of a wired or wireless communications network. In the case of an optical or baseband wired network, for example, the placement and performance of components can be visualized within the invention to ensure that proper portions of the environment are supplied with service, so that users within the environment may connect directly (with a hard-wired connection) or via a wireless or infrared connection which can be provided throughout the wired network using translators, converters, wireless access points, and other communication components that facilitate frequency translation and wireless access from the wired network. The three-dimensional visualization of system performance provides RF and network system designers with tremendous insight into the functioning of the modeled wireless or wired communication system, and represents a marked improvement over previous visualization techniques.

To accomplish the above, a 3-D model of the physical environment is stored as a CAD model in an electronic database. The physical, electrical, and aesthetic parameters attributed to the various parts of the environment such as walls, floors, foliage, buildings, hills, and other obstacles that affect radio waves or which impede or dictate the routing of wiring paths and other wired components are also stored in the database. A representation of the 3-D environment is displayed on a computer screen for the designer to view. The designer may view the entire environment in simulated 3-D, zoom in on a particular area of interest, or dynamically alter the viewing location and perspective to create a "fly-through" effect. Using a mouse or other input positioning device the designer may select and view various communication hardware device models that represent actual communication system components from a series of pull-down menus. A variety of amplifiers, cables, connectors, and other hardware devices described above which make up any wired or wireless communication system or network may be selected, positioned, and interconnected in a similar fashion by the designer to form representations of complete wireless or wired communication systems.

In the present invention, the designer may run performance prediction calculations, measure actual performance characteristics within an environment, or gather performance data using some other method known now or in the future. A point of novelty of the current method and apparatus is for displaying the results of measurements, comparisons of measurements, and comparisons of predicted performance results using a 3-D visualization method that is well suited for use within the 3-D model of the physical environment such that an engineer or technician can rapidly determine the meaning or importance of the measurement or comparison of measurements or comparison of performance results while viewing the display within the electronic model of the environment which shows the approximate or exact location from where each measurement or the comparison of measurements or comparison of performance results were collected or computed.

The method presented additionally provides a means for visualizing a 3-D iconic view of predicted performance values. Using a cylindrical or other shape object with varying height and color, the present invention allows for rapid visualization of complex performance data at a select number of points in the environment termed "watch points".

The present invention extends the prior art in this area by allowing a designer a quick, 3-D view of performance data overlaying the environment model.

The present invention additionally creates a new method and system for providing a way to conveniently visualize individual measurement watch points for rapid inference of meaning, as well as conveniently visualizing and rapidly inferring the meaning of differences between measurement runs collected within the same 3-D environment, using the same or different communication network designs. A measurement run is a series of measurements, usually performed by a technician or engineer within an environment (such as a city, a town, a campus, a group of buildings, or a building of interest), although such measurements may be carried out by non-technical people and may even be carried out remotely or autonomously (e.g., by measurement devices used by a number of technicians walking through the physical environment, each being outfitted with a measurement device which randomnly makes measurements and where these measurements are all shared; this being more adequately described in U.S. Ser. No. 09/628,506 filed Jul. 28, 2000 entitled "System, Method and Apparatus Design, Deployment, Test and Optimization of a Communication Network, which is herein incorporated by reference).

The invention supports the rapid visualization and display for comparing performance data gathered from a multitude of sources. The comparisons may be between two or more different sets of measurements made within the same 3-D environment of interest as described above. However, the comparisons may also be between two or more sets of network system performance prediction results that may be computed, displayed, or stored for latter display. The present invention creates a new method and system for providing a way to rapidly visualize the differences between different network system performance prediction results collected within the same 3-D environment, using similar or different communication network designs within the common environmental model.

In addition to the above considerations, the present invention provides a means of displaying the differences between measured data and predicted data in a convenient manner which yields great insight into actual versus predicted performance of any communications network. Based on the above teaching, it should be clear that measured data and predicted data may be displayed in a 3-D environment, and may be overlaid upon each other in space, in order to provide a registration of measured and predicted values. In this manner, it is possible to compare measurement runs to prediction runs, so long as the measurements are collected at points which are specified as desired locations for outputs of the prediction engine. One of ordinary skill in the art would be trained in data processing and error analysis and would be able to understand how novel visualization techniques that apply to: a) measured data, b) the comparison of measured data, and c) the comparison of predicted data could also be applied to the comparison of measured to predicted data. Using the novel visualization methods which are described subsequently to compare measured versus predicted values offers tremendous power for engineers who seek to develop and optimize and use prediction models that perform most accurately in particular physical environments.

Comparisons of data points between prediction runs, measurement runs, or comparisons between prediction and measurement runs may be made in several ways. Data sets can be compared on a simple difference basis, where the numerical value of the data point in the first run (located at a specific location in the environmental database) is subtracted from the data point at the same corresponding location from the second run. Of course, the subtraction order may be reversed if preferred. Other ways of comparing data include computing a decibel (dB) difference, which corresponds to a logarithmic ratio of the two numerical values at the same location point. Alternatively, a relative value, which considers the largest or best value having a maximum value (say 100 or 1), and the smaller value is displayed as having a value less than the maximum. The level below the maximum value may be computed and displayed as the normalized value, or as a percentage, as compared to the maximum.

One difficulty in comparing measured data with predicted data, or comparing measurements or predictions that have been performed with different grid scales or data base resolutions is that the same corresponding location between the two data sets may not be tractable, for example, due to inexactness of registering position information of the field measurements with the modeled environmental location in the predictions. In this case, a nearest neighbor approach for point selection, or a random selection technique from a cluster of nearest neighbor points, may be made in order to determine the suitable point in each run to compare between. Or, an averaging method may be used, whereby local points in each of the data sets to be compared are averaged within a very small local area, and the resulting numerical values from each set are compared at a physical location point which is common to the small region occupied by the points used for averaging in each data set. This is known as "local averaging", and statistics may be deduced from the mean and variation of the local average of data in a particular run. These statistics may be compared and differences displayed between the statistics of each of the two runs under comparison. There are numerous other comparison methods that may be used to compare numerical values from two sets, and such comparison methods are considered, whether or not known now or in the future.

Some data sets may be sparse compared to others which are offered up for comparison. In this case, a display mechanism is needed to illustrate that a comparison at a particular 3-D location point may not be made because of missing data from one or both of the sets.

The preferred embodiment of the invention allows for the visualization of such comparisons using a variety of methods. Building on the concepts disclosed in co-pending application Ser. No. 09/318,840, entitled "Method and System for Automated Optimization of Antenna Positioning in 3-D", the present invention allows for one or more locations in space to serve as "watch points" where comparisons are stored as part of a 3-D computer database and visualized on a display screen. The display of said watch points may be in a 2-D manner utilizing colors, shape, and/or text to indicate comparison data, or in a 3-D manner using height, color, shape, and/or text to indicate comparison data.

In addition to visualization at one or more watch points, the present invention allows for a mesh of vertices indicating comparison data to be overlaid on top a selected region of any size or shape.

The computer displays on the screen at each vertex of the mesh the comparison data indicating variations in RF performance values, for instance, received signal strength intensity (RSSI), network throughput, packet latency, packet error rate, quality of service (QoS), bit error rate, frame error rate, signal-to-interference ratio (SIR), and signal-to-noise ratio (SNR), provided by the communication systems just designed. The display is such that the computer adjusts the elevation and/or coloring including characteristics such as saturation, hue, brightness, line type and width, transparency, surface texture, etc., of each vertex relative to the surrounding vertices to correspond to the calculated comparisons of RF performance values. The coloring and elevation may correspond to the same calculated comparison value or to different variations in calculated comparison values. For example, elevation may correspond to comparisons between received signal strength intensity (RSSI), and color may correspond to comparisons between signal-to-noise ratio (SNR), or any other of a variety of comparisons between calculated RF parameters. The user is able to specify boundaries for this display in terms of selecting the range of elevations, colors, or other aesthetic characteristics from which the vertices of the mesh are assigned. Alternatively, the system can automatically select limits and ranges for the heights, colors, and other aesthetic characteristics. The result is a region of fluctuating color and elevation representing the changing comparisons between wireless system performance throughout different portions of the modeled 3-D environment. The region may be viewed as an overlay within the 3-D environment.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Using the present method, it is now possible to assess the performance of a communication system to a much higher level of precision than previously possible. The present method is a significant advance over the prior art in the display of predicted performance of communication systems. The design of communication systems is often a very complex and arduous task, with a considerable amount of effort required to simply analyze the results of system performance.

In the prior art, only a single performance prediction result could be analyzed at once. That is, having designed a communications system, there was no direct way to quickly visualize and compare advantages between having a hardware component in one communications network layout or another. In the present invention, a system is described where two or more predictions may be compared to analyze advantages or disadvantages between designs, models, or other factors.

The present invention also allows for a measurement campaign to be compared with predicted performance data for analysis purposes. In the prior art, there are some implementations available for comparing measured and predicted data sets. Most, however, are not visual comparisons; moreover, those packages available for displaying visual comparisons between measurements and predictions are 2-D only. That is, until this invention there is no way to fully visualize such comparisons for a communication network in a 3-D manner.

The present invention describes several methods for visualization of comparisons between communication system performance values which are either predicted or measured. In all cases, the visualization described could be applied to measurements, predictions, comparisons between prediction models, comparisons between predictions of different communication systems, comparisons between predicted and measured data, comparisons between different measurement data sets, or comparisons between other data known now or in the future.

Figure 1:
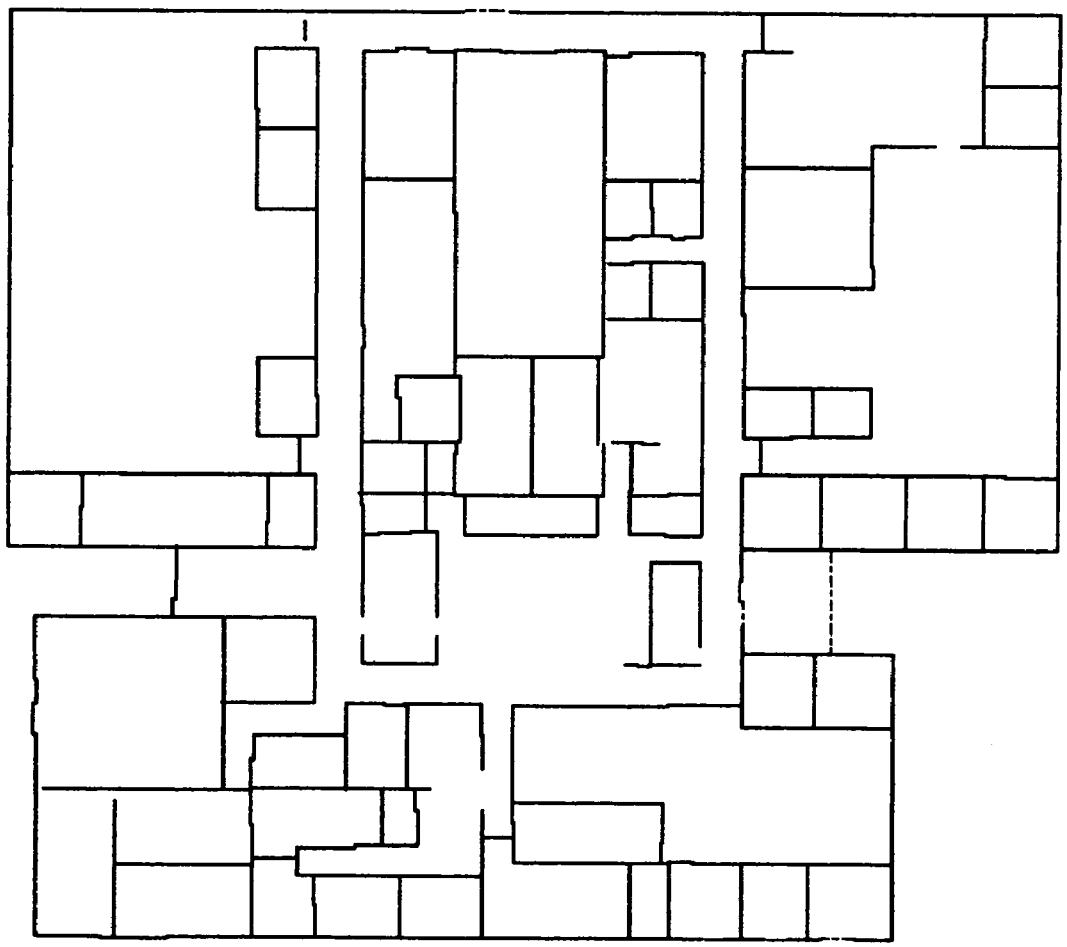
FIG. 1 shows an example of a simplified layout of a floor plan of a building.

Referring now to FIG. 1, there is shown a two-dimensional (2-D) simplified example of a layout of a building floor plan. The method uses 3-D computer aided design (CAD) renditions of a building, or a collection of buildings and/or surrounding terrain and foliage. However, for simplicity of illustration a 2-D figure is used. The various physical objects within the environment such as external walls, internal walls and floors are assigned appropriate physical, electrical, and aesthetic values. For example, outside walls may be given a 10 dB attenuation loss, signals passing through interior walls may be assigned 3 dB attenuation loss, and windows may show a 2 dB RF penetration loss. In addition to attenuation, the obstructions are assigned other properties including reflectivity and surface roughness.

Figure 2:
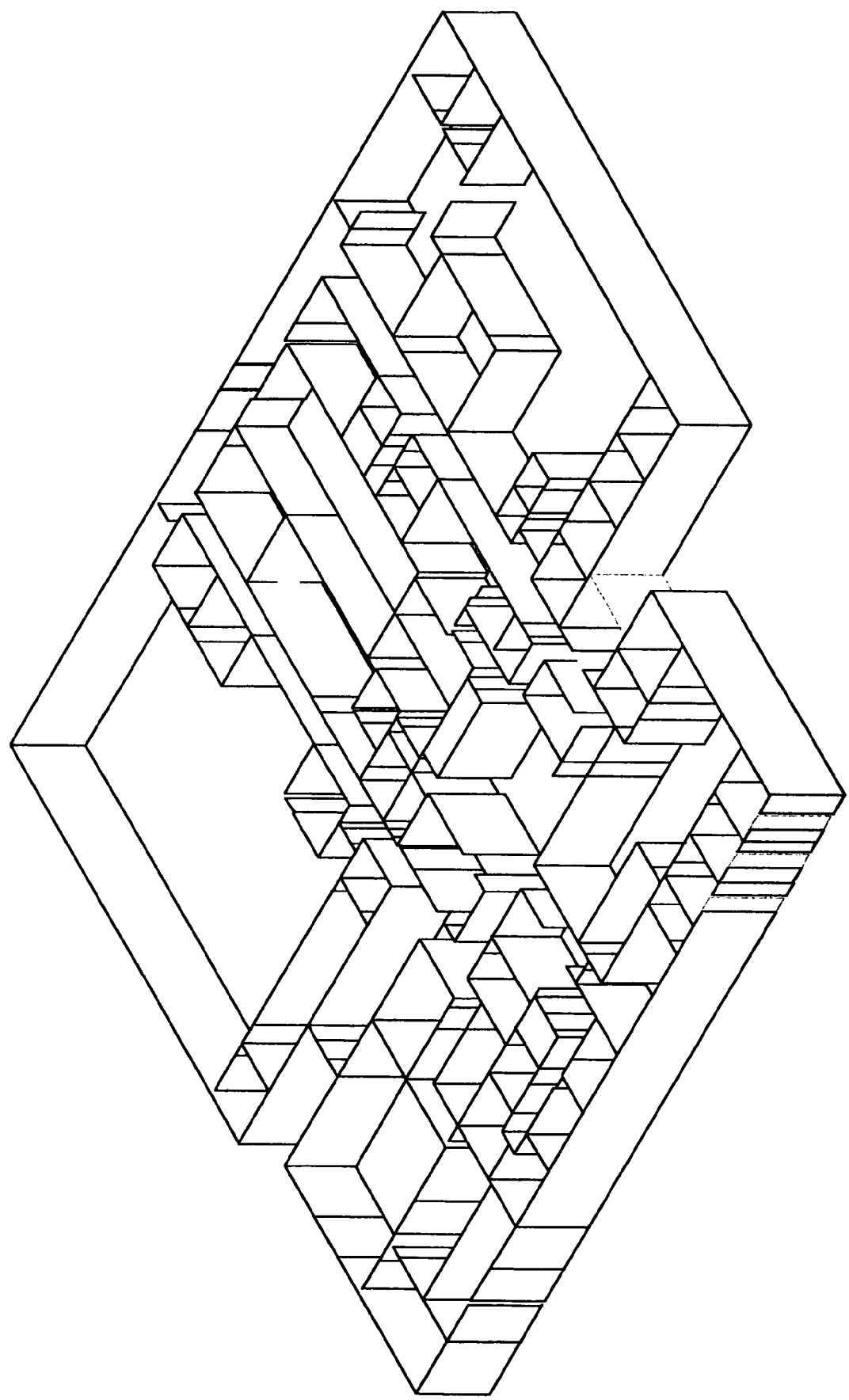
FIG. 2 shows a three-dimensional perspective of a building floor plan.

FIG. 2 depicts the three-dimensional perspective of a building floor plan. Referring to FIG. 2, there are several partitions within the building structure, including exterior concrete walls and interior sheetrock walls.

Estimated partition electrical properties loss values can be extracted from extensive propagation measurements already published, which are deduced from field experience, or the partition losses of a particular object can be measured directly and optimized instantly using the present invention combined with those methods described in the copending application Ser. No. 09/221,985, entitled "System for Creating a Computer Model and Measurement Database of a Wireless Communication Network" filed by T. S. Rappaport and R. R. Skidmore. Once the appropriate physical and electrical parameters are specified, any desired number of hardware components of RF sources can be placed in the 3-D building database, and predicted RF performance values such as received signal strengths (RSSI), network throughput, packet latency, packet error rate, quality of service (QoS), bit or frame error rate, chip energy to interference ratio (Ec/Io), or carrier-to-interference (C/I) ratios can be obtained. Of course, other well known communication parameters for wired or wireless communications systems, known now or in the future, may be used for appropriate prediction values. The preferred method for generating a 3-D environmental database is disclosed in the co-pending application Ser. No. 09/318,841, filed on May 26, 1999. The resulting definition utilizes a specially formatted vector database comprising lines and polygons that represent physical objects within the environment. The arrangement of lines and polygons in the database corresponds to physical objects in the environment. For example, a line or other shape in the database could represent a wall, a door, a tree, a building wall, or some other physical object in the modeled environment.

From the standpoint of radio wave propagation, each obstruction/partition in an environment (i.e., each line or polygon in the drawing) has electromagnetic properties that affect a radio wave. When a radio wave signal intersects a physical surface, it interacts with the electromagnetic properties of the surface. A certain percentage of the radio wave reflects off of the surface and continues along an altered trajectory; a certain percentage of the radio wave penetrates through the surface and continues along its course; a certain percentage of the radio wave is scattered once it strikes the surface, etc. The electromagnetic properties given to the obstruction/partition defines this interaction, and thus defines the break down in percentages of the radio wave reacting in a given manner upon intersection. In terms of the environmental database, each obstruction/partition has several parameters used to define its electromagnetic properties. For example, the attenuation factor of a partition determines the amount of power lost by a radio signal that penetrates through it; the reflectivity of a partition determines the portion of the radio signal reflected from it; and the surface roughness of a partition determines the portion of the radio signal that is scattered upon intersection.

Once the 3-D environmental database has been constructed, the designer identifies and specifies the location and type of all wireless communication system equipment within the 3-D environmental. This point-and-click process involves the user selecting the desired hardware component from a computer parts database and then visually positioning, orienting, and interconnecting various hardware components within the 3-D environmental database to form complete wireless communication systems. The preferred embodiment of the computer parts database, referred to hereinafter as a parts list library, is more fully described in co-pending application Ser. No. 09/318,842, filed on May 26, 1999. The resulting interconnected network of base station transceivers, cabling, connectors/splitters, amplifiers, antennas, and other RF hardware components (commonly known as a wireless distribution or antenna system) is preferably assembled using either a drag-and-drop or a pick-and-place technique and is graphically displayed overlaid with the 3-D environmental database. Each component utilizes electromechanical information available from the parts list library that fully describes the component in terms of its physical operating characteristics (e.g., the noise figure, frequency, radiation characteristics, etc.). This information is directly utilized during the prediction of wireless system performance metrics.

Having a complete 3-D environmental model and a wireless communications system placed within the environment, the designer may acquire performance data by running prediction models on the communications system, collecting RF measurement data from the actual site the environmental model represents, or by some other method known now or in the future.

In the present invention, the designer may run performance prediction calculations, measure actual performance characteristics within an environment, or gather performance data using some other method known now or in the future. The novelty of the current method and apparatus is for displaying the results of measurements, performance prediction results, comparisons of measurements to performance prediction results, comparisons of two or more predicted performance results, and comparisons of two or more measurements. The 3-D visualization method allows an engineer or technician to rapidly determine the meaning or importance of the displayed information.

To visualize performance or performance comparisons, several methods are employed in the present invention. When two sets of performance data are available, a direct visualization may be made. That is, statistics such as a difference or absolute difference, a percentage, a ratio such as decibels (dB), or some other statistics known now or in the future may be employed. Given two sets of performance data of equal size, the desired statistical calculations are performed on each element in the sets. In the event one of the data sets is larger than the other or the two data sets do not contain the same spatial elements, comparison calculations are performed on each element residing at the same spatial location in both data sets. Where there is misalignment between the two sets, an averaging, nearest neighbor, or random method could also be used to obtain registration in space.

Figure 3:
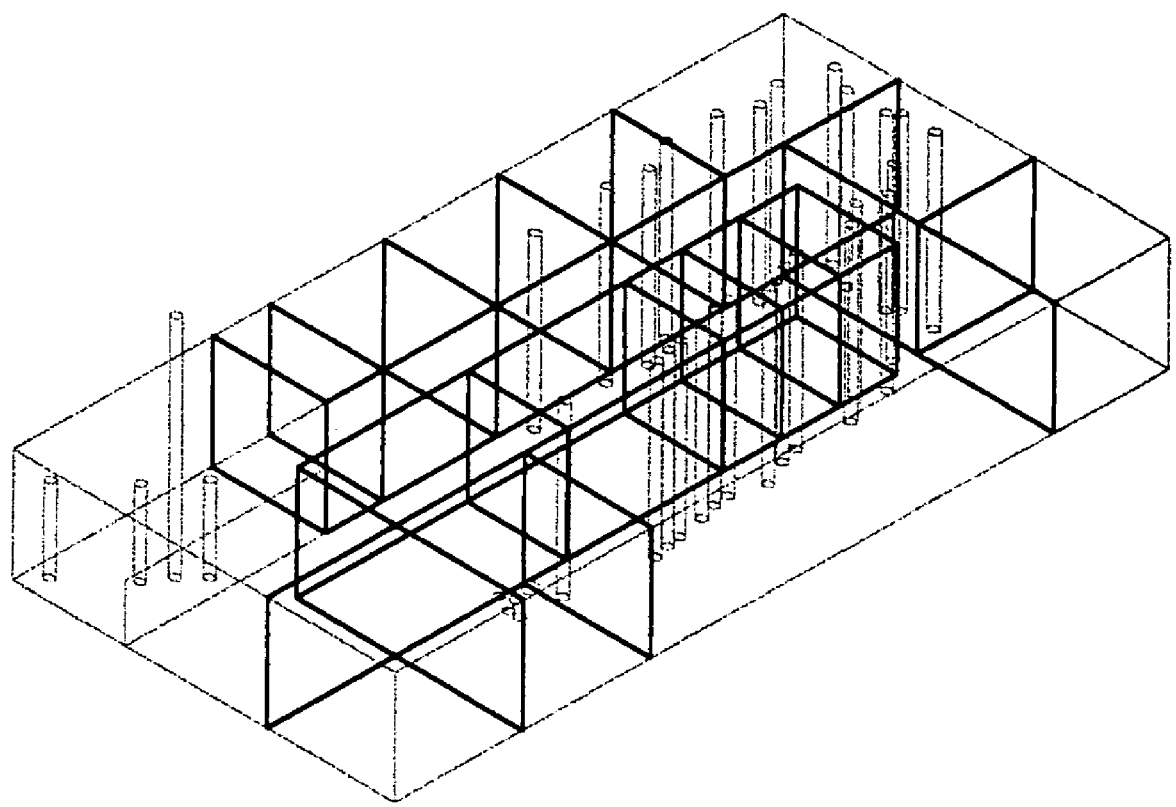
FIG. 3 shows a three-dimensional perspective of a comparison of a set of performance values.
Figure 4:
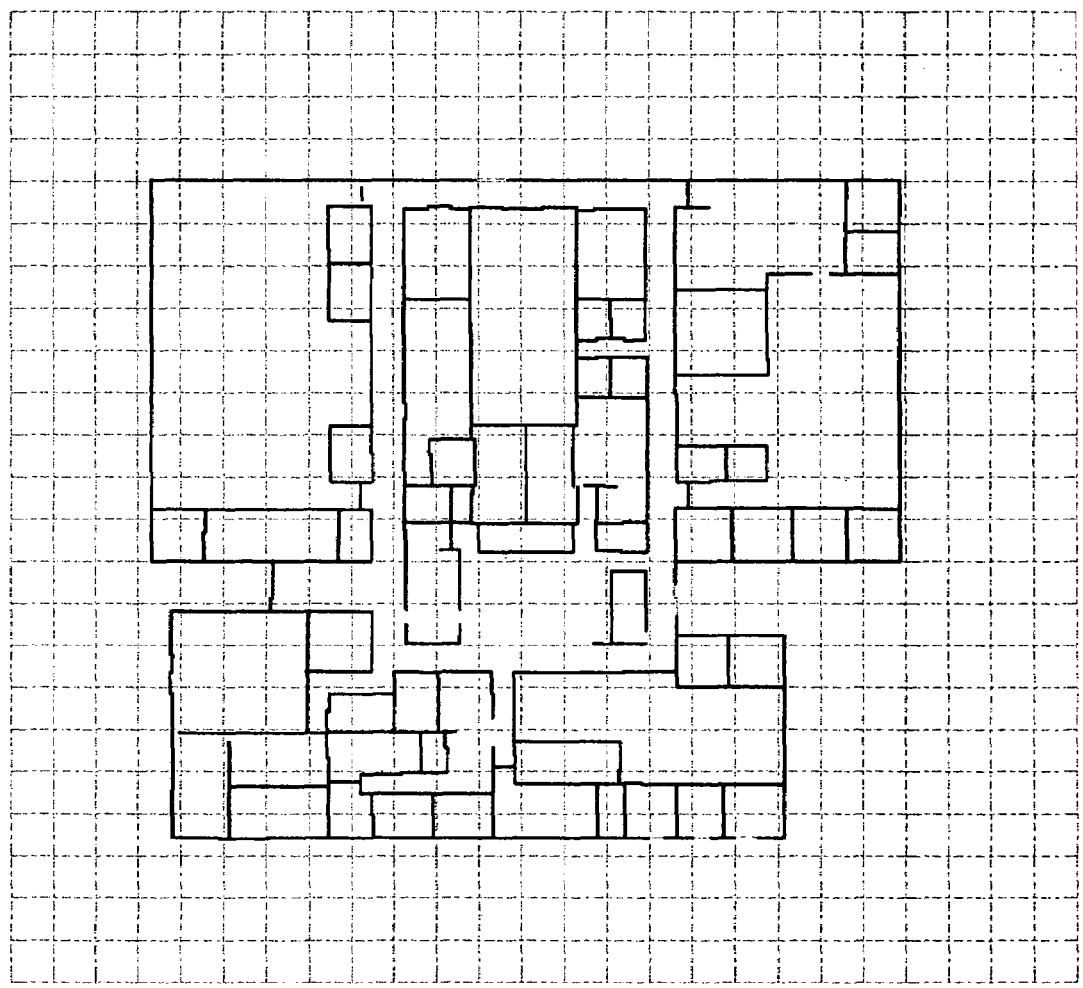
FIG. 4 shows an example region segmented into a grid that has been selected by a RF designer for displaying wireless system performance.
Figure 5:
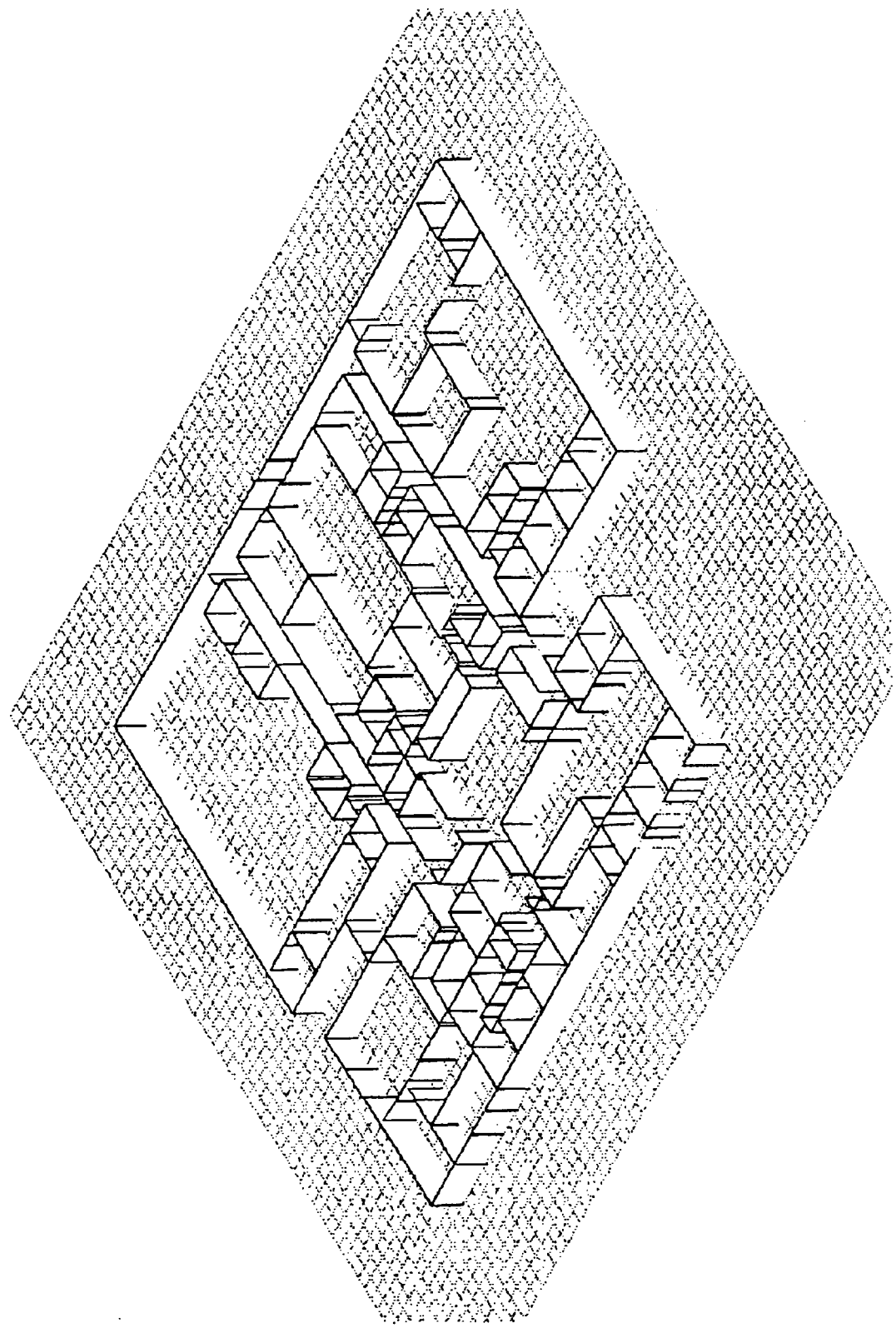
FIG. 5 shows a region similar to that shown in FIG. 4 prior to the comparison of wireless system performance and from a three-dimensional perspective.

The resulting comparison calculations may be visualized directly on the 3-D environment database. Using variations in object shape, color, and/or height, the calculations may be visualized as shapes such as cylinders, rectangular prisms, spheres, cubes, or other objects directly in the 3-D environment database to show performance comparisons. FIG. 3 depicts a comparison of performance values where cylinders of varying height and color are shown in 3-D to indicate differences between predicted and measured data.

Where sufficiently many data points are available, a grid of many vertices indicating varying height and/or color may be overlaid on the 3-D environmental database to indicate spatial fluctuations in performance comparisons. FIG. 4 shows an environmental database that has been segmented into a grid of vertices. Each vertex will correspond to a comparison data location. FIG. 5 shows the same environmental database and overlaid grid from a 3-D perspective.

Figure 6:
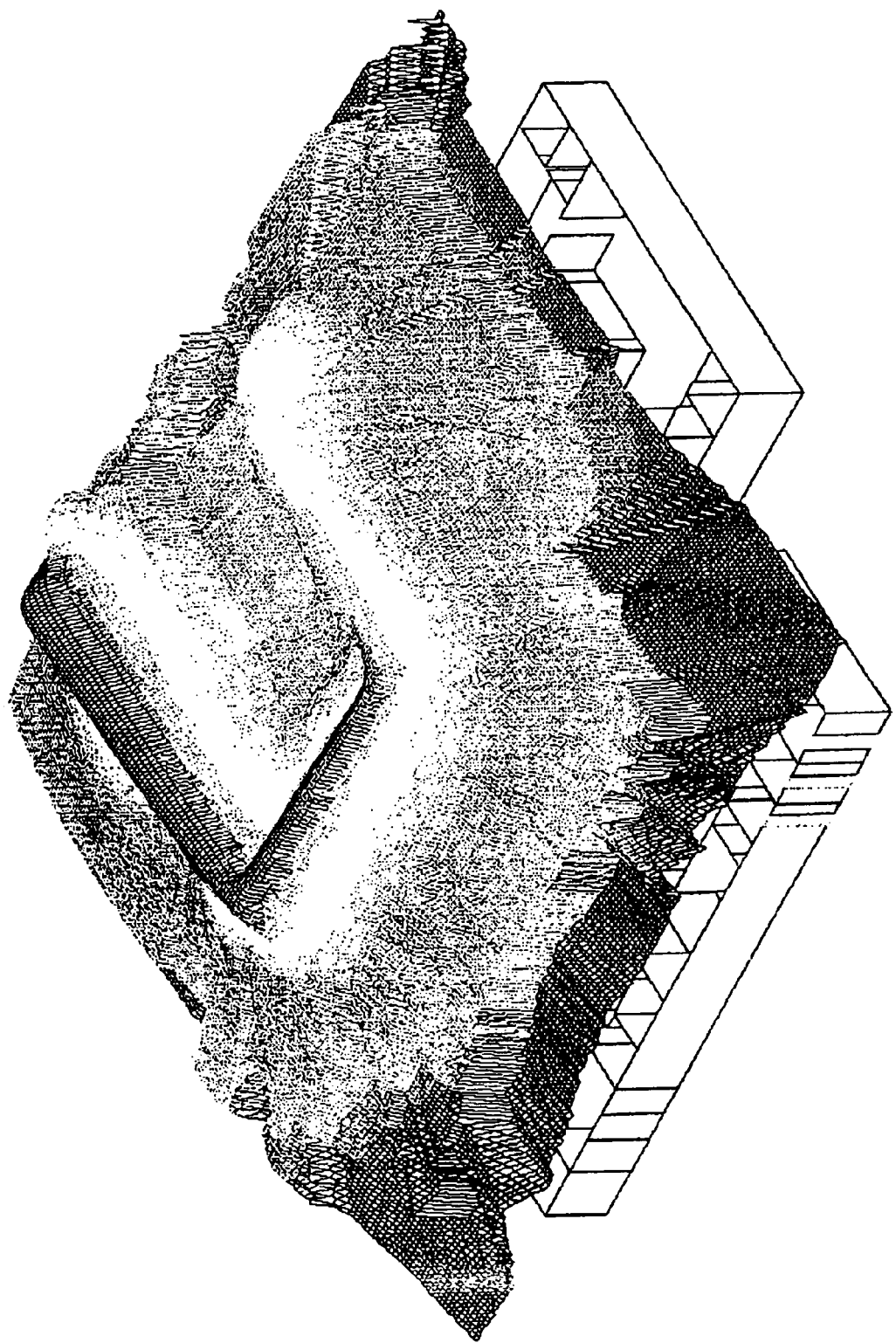
FIG. 6 shows a region following the comparison calculation of wireless system performance and is exemplary of the three-dimensional display of system performance from the present invention.

Once the performance comparison is complete, the designer is free to configure the display of the results. The displayed results may be presented on a display screen, printed or otherwise 3-D rendered. The range of values to display and the color and other aesthetic characteristics such as saturation, hue, brightness, line type and width, transparency, surface texture, etc., to associate with each value are selectable, or may be automatically adjusted by the system. For example, if displaying comparisons between received signal strength intensities (RSSI), the user may select to only display those portions of the region having a relative RSSI difference within the range −20 dBm to 20 dBm, and may assign specific colors to correspond to compared RSSI values within that range. For example, the user may assign the color red to represent a relative RSSI difference between −20 dBm and −10 dBm, green to represent a relative RSSI difference between −9 dBm and 0 dBm, etc. Thus, the region is displayed as a pattern of fluctuating colors where the color assigned to each vertex within the grid corresponds to a certain value for the compared performance metric. FIG. 6 depicts a 3-D comparison graphically, using variations in height and color to indicate differences between communication system performance.

Figure 7:
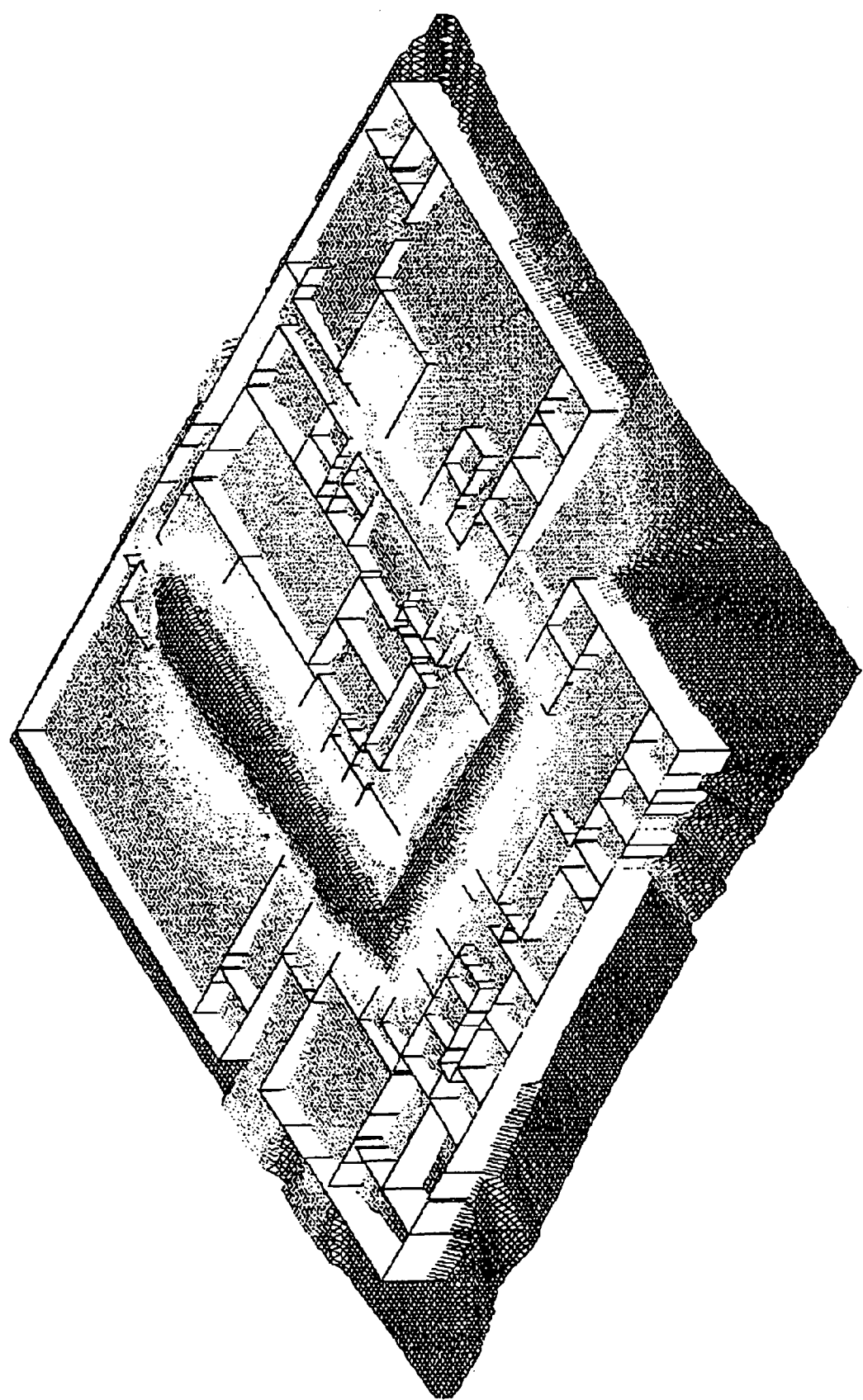
FIG. 7 shows the same region as in FIG. 6 following the user reducing relative elevations of the vertices and thus altering the display.

In similar fashion, each vertex of the grid or other point in space representing a performance comparison data point is repositioned vertically in 3-D space. The elevation of each comparison data point directly corresponds to a certain value of compared performance. In the preferred embodiment of the invention, the user specifies the maximum and minimum elevation to assign to vertices, and the computer automatically scales the elevation of each comparison data point according to its compared performance value. For example, if the user selects a minimum height of 0.0 meters and a maximum height of 20.0 meters, and the compared performance values for the entire grid range from −20 dBm to 20 dBm for an RSSI difference comparison, if a given comparison data point has a value of 0 dBm it will be assigned an elevation of 10.0 meters. All elevations are specified relative to the 3-D environmental database. FIG. 7 depicts a 3-D comparison that has been repositioned for better viewing and analysis.

Any combination of elevation, color, and other aesthetic characteristics may be used to customize the display of compared performance results. For example, signal-to-interference ratio (SIR) differences may be displayed as fluctuating elevation within the region while received signal strength (RSSI) differences are displayed by fluctuating colors. Data throughput percentages may be displayed as varying colors while bit error rate (BER) differences are displayed using differing line types. Any combination of elevation, color, and other aesthetic characteristics may be associated with any combination of compared performance result metric to produce the 3-D display.

Figure 8:
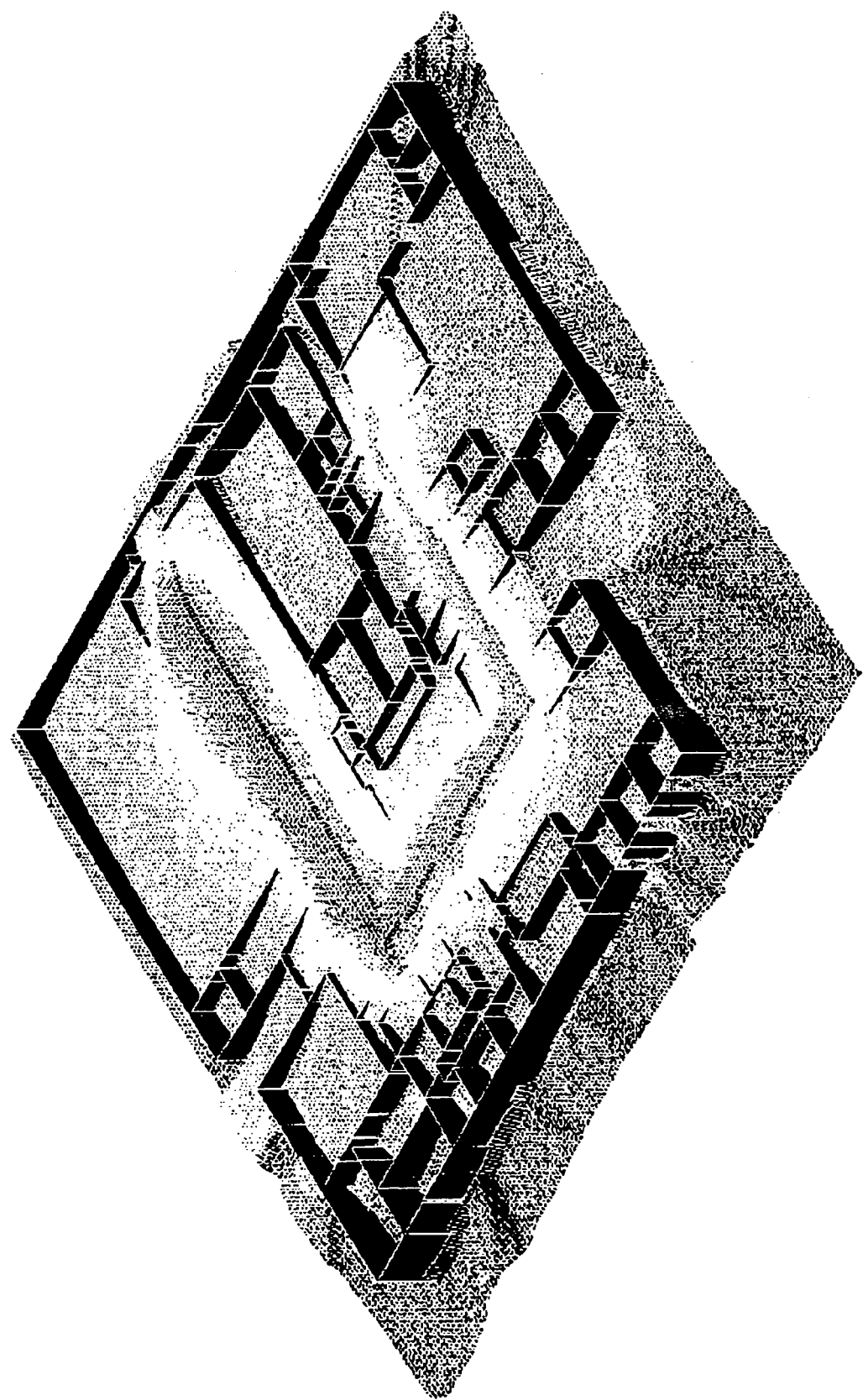
FIG. 8 shows the same region as in FIG. 7 following the user shading the display to produce an altered perspective of the performance results.
Figure 9:
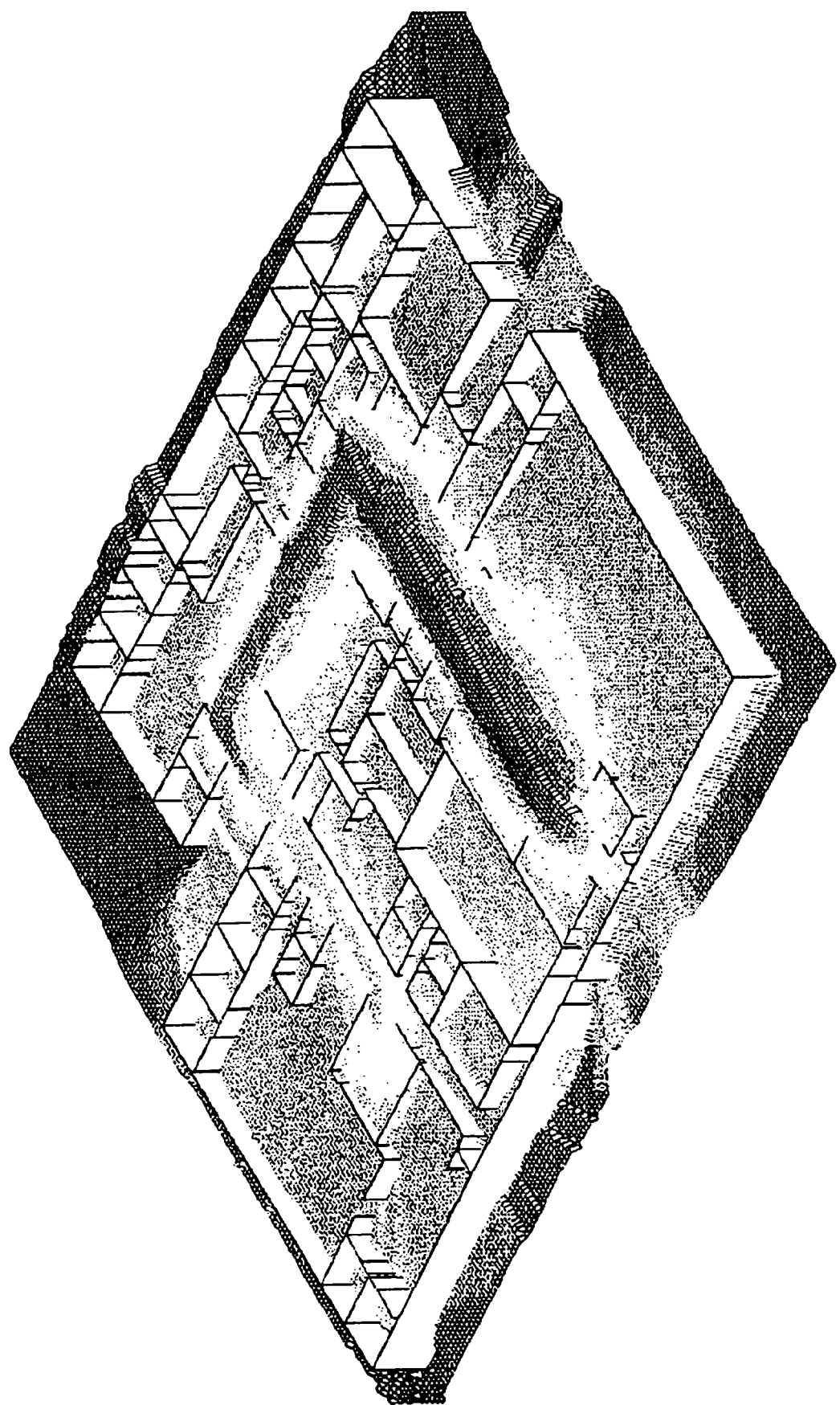
FIG. 9 shows the same region as in FIG. 6 following the user changing the view orientation to provide a different perspective of the performance results.

The results of the performance comparison are overlaid with or superimposed on the 3-D environmental database, allowing the user to analyze the performance of the current wireless communication system design. The display can be further customized through user interaction. The designer may reorient the viewing direction and zoom factor of the display to achieve varying perspectives of the comparison results. The results may be redisplayed in a variety of forms, including 3-D wireframe with hidden lines removed, 3-D semi-transparent, 3-D shaded or patterned, 3-D rendered, or 3-D photo-realistically rendered. The designer is free to interact with the displayed results in a variety of ways, including real-time panning and zooming to create a "fly-through" effect. FIG. 8 depicts a comparison of system performance where the 3-D display has been appropriately shaded for viewing and analysis purposes. Similarly, FIG. 9 shows the same comparison from a different viewpoint. The compared performance results may be saved for later recovery and redisplay.

In the event that more than two data sets are available for comparison, a sequential animation showing the graphical 3-D comparisons between any two sets can be shown. The designer is able to control which two sets are compared at any time, and can easily flip through a large number of comparisons.

The present invention creates a new method and system for providing a way to conveniently visualize individual measurement points for rapid inference of meaning, as well as conveniently visualizing and rapidly inferring the meaning of differences between measurement runs collected within the same 3-D environment, using the same or different communication network designs. A measurement run is a series of measurements, usually performed by a technician or engineer within an environment (such as a city, a town, a campus, a group of buildings, or a building of interest), although such measurements may be carried out by non-technical people and may even be carried out remotely or autonomously (e.g., by measurement devices used by a number of technicians walking through the physical environment, each being outfitted with a measurement device which randomnly makes measurements and where these measurements are all shared; this being more adequately described in U.S. Ser. No. 09/628,506, filed Jul. 28, 2000 entitled "System, Method and Apparatus for Portable Design, Deployment, Test and Optimization of a Communication Network, which is herein incorporated by reference).

We consider measurements to have a position location tagged with each measurement, using either automatic or manual means as taught in the co-pending application Ser. No. 09/221,985, filed Dec. 29, 1998. As described subsequently, the present invention performs comparisons and provides novel displays for different measurement runs, which may be a collection of measured points that are collected from a single communication network at different times of day, on perhaps different days, using the same or different frequencies, using the same or different operational modes (where different operational modes may include, but not be limited to, one or more of the following: different data transmission rates, different packet sizes, different modulation techniques, different power levels, different psuedonoise code sequencing, different psuedonoise code chip timing, different optical frequency bands, different network protocols, different bandwidths, different multiple-access techniques, different antenna distribution systems, different antenna systems, different wiring architectures, different cabling methods or system distribution methods, different physical interconnections of system components to comprise the communication system, or different source or error correction coding methods), or under different traffic loading conditions (due to bandwidth variations, user density, or some other means that causes traffic flow or capacity to change over time). Alternatively, measurement runs may be made in a particular environment where two or more different communication systems are installed to provide network connectivity within the environment. This is common when one attempts to measure two or more competitive wireless service providers within a city or campus environment, or when one wishes to compare the performance of two or more different network architectures within a particular environment.

As an example, a measurement run for a wireless inbuilding system might involve a technician using a mobile receiver who would canvass each floor of the building to measure the received signal from the installed inbuilding wireless office system. The technician might use the InFielder™ 3-D measurement system connected to a WaveSpy™ scanning receiver to measure, say, RSSI values, within the 3-D environment of interest, whereby a model of the 3-D environment resides within InFielder. The same or a different technician might then measure again the same building, either simultaneously, at a later date, or under different operational conditions. As shown subsequently, the present invention provides a novel way to display the difference of two or more measurement runs for comparison, and to display such differences so that rapid comparisons may be made by visualizing the resulting differences within the model of the 3-D environment.

While the above example is for an in-building wireless system, it will be clear to one trained in the art of design, installation, and maintenance of any communication network that similar methods may be applied to the comparison and display of measurement runs for any type of communication network, and where such measurement runs could be made for a single network in a particular environment, or for two or more differently configured communication networks within the same physical environment, and that this approach may apply to optical networks, baseband networks, and a collection of wireless and wired networked devices which might share a common or different wired or wireless backbone(s). For an optical network within a building, for example, a measurement run would consist of making measurements at each wall terminal or cable junction box within the building. Rather than roam around, the measurement run for a fixed network would consist of taking samples at fixed locations. The present invention provides for display of such measurements within a 3-D environment as well as a convenient display for comparing two or more such measurement runs. Furthermore, measurement runs may include the collection of measured values or sample values, collected over time and space, of any or all of the various network system performance values taught earlier, and these measurements could be conducted within the environment simultaneously by two or more measurers or measurement devices, or conducted at different times by one or more measurers or measurement devices. Alternatively, one can contemplate measurement methods that allow multiple sensors/receivers or multiple transmitters to simultaneously record measurement data, and such data and comparisons between data may be displayed using methods taught subsequently in this invention.

A network system performance prediction result is a numerical value or a string of numerical values produced by a communication system modeler or simulator that serves as an estimate for a measured numerical value or string of numerical values that would be produced (e.g. measured or seen) by an actual communication system operating in the specified configuration and environment used for the performance prediction. The numerical values or string of numerical values represent certain communication parameters, quality metrics, or physical representations of the operating environment that can generally be measured by a network system communication device or a system of devices which can be used to predict the suitability or performance of a particular communication device within the environment. Appropriate and commonly used measurements and parameters and physical representations are taught earlier, and are well known to those skilled in the art of communication system design, network design, and measurement of communication systems. Network system performance prediction results are created by one or more analytical calculations, empirically applied models, or simulation outputs that are computed within a prediction engine, which may or may not use measurements at the time of computation. The network system performance prediction results allow engineers or technicians to properly install or design communication devices, and attempt to include the effects of the operating environment so they can be used by a network system designer to make sensible judgments and predictions about how well a proposed system might perform. The complexities of a multiple-user local or wide area network are extreme, and it is not possible to model all of the variables which cause a particular network to perform a particular way at a particular time and spatial location. However, researchers have developed key findings that help isolate the most important factors that dictate network performance, and these most important factors are generally used in the computations that yield network system performance prediction results. For example, as shown in Rappaport (T. S. Rappaport, Wireless Communications, Principles and Practice, Prentice Hall, 1996, NJ), in a wireless communication system, if the physical distance between a transmitter and receiver is known, and the physical environment is known and modeled for various partition losses, it is possible to create an analytical site-specific communications model that yields the unequalized bit error rate for a wireless device that uses BPSK modulation. From this model, it becomes possible to carry out network designs, based on bit error rate, in a 3-D environment. Similar models, of the analytical, empirical, and simulation-based kind, exist for optical, wireless, and baseband networks.

Network system performance prediction results may be computed within any environment (such as a city, a town, a campus, a group of buildings, or a building of interest). As described subsequently, the present invention performs comparisons and provides novel displays for comparing the results of different network system performance prediction results, whereby each collection of network system performance prediction results performed throughout a part of the modeled environment is called a prediction run, where a prediction run is a collection of one or more predicted values at points or grids or volumes over space that are produced from one or more modeled communication network(s) simulated in the prediction engine, but which may be simulated multiple times to produce different resulting prediction runs that may be compared, using the same or different frequencies, using the same or different operational modes (where different operational modes may include, but not be limited to, one or more of the following: different data transmission rates, different packet sizes, different modulation techniques, different power levels, different pseudo-noise code sequencing, different pseudo-noise code chip timing, different optical frequency bands, different network protocols, different bandwidths, different multiple-access techniques, different antenna distribution systems, different antenna systems, different wiring architectures, different cabling methods or system distribution methods, different physical interconnections of system components to comprise the communication system, or different source or error correction coding methods), or under different traffic loading conditions (due to bandwidth variations, user density, or some other means that causes traffic flow or capacity to change over time). Alternatively, network system performance prediction results may be computed in a particular environment where two or more different communication systems are modeled to provide network connectivity within the environment. This is common when one attempts to understand or predict how alternative communication network architectures within a particular environment might perform.

As an example, network system performance results might be computed to create a prediction run for predicted signal-to-noise ratio (SNR) for a wireless inbuilding system throughout a building. If the models used in the prediction engine were sufficiently accurate, then such a process would eliminate the need for measurement runs in order to install a properly functioning system. In the prediction engine contemplated by SitePlanner®, which is disclosed in part in all of the cross referenced co-pending applications listed above, various performance parameters which provide electrical, mechanical, numerical, or physical descriptions of the modeled communication system must be provided. These performance parameters may include the addition, removal, replacement, re-connection, re-orientation, or some other modification of one or more attributes which describe one or more of the effects that are required for accurate simulation performance of the prediction engine. Some examples of such inputs might include: physical locations of transmitters, antennas, RF distribution lines, connectors, splitters, base station controllers, switches, optical-to-RF couplers; cable losses, splitter losses; antenna patterns; power levels of the transmitters; gains of the amplifiers, and frequencies to be simulated, must be applied to the input of the prediction engine. While the list in the preceding sentence is not meant to be exhaustive, it demonstrates the level of detail and interconnectivity dependencies that are considered to properly model the transmission system, both physically and electrically, as it would actually be installed in a real building. This is because of the visualization capabilities of the invention which focuses on illustrating the network as it really appears in true life. Other inputs required by the prediction engine include a 2-D or 3-D computerized model of the actual operating environment, with specified floor locations, ceiling heights, and other 3-D information, or maps which are either 2-D or 3-D. To compute, store, and display the network system performance results in the 3-D environmental model, particular points, grids, or zones must be specified or requested by the user in order to determine the exact 3-D location of where the network system performance results (in this case, SNR) will be computed and displayed. Upon completion of a sequence of simulations throughout the environment, a prediction run will be created and displayed.

Prediction runs produced by the prediction engine may consider alternate models, communication network architectures, or different operating modes within the same physical environment, as well as other obvious perturbations that would be appropriate and interesting to a wireless network designer, either now or in the future. As shown subsequently, the present invention provides a novel way to display the difference of two or more prediction runs for comparison, and to display such differences so that rapid comparisons may be made by visualizing the resulting differences within the model of the 3-D environment.

While the above example is for an in-building wireless system, it will be clear to one trained in the art of design, simulation or analysis of any communication network that similar methods may be applied to the comparison and display of prediction performance results and prediction runs for any type of communication network, and where such predictions could be made for a single network modeled in a particular environment, or for two or more differently configured communication networks modeled within the same physical environment, and that this approach may apply to networks and systems modeled as optical networks, baseband networks, and a collection of wireless and wired networked devices which might share a common or different wired or wireless backbone(s). For predictions of a wired optical network within a building, for example, simulations designed to produce network system prediction results would consist of providing the proper inputs and environmental model to the prediction engine, and then specifying output values be provided in the modeled environment at the exact location of each wall terminal, port, or cable junction box within the modeled building. The present invention provides for display of differences between two or more prediction runs within a 3-D environment as well as a convenient display for comparing two or more such prediction runs. Furthermore, prediction runs may include collections of predicted values, collected over time and space, for any or all of the various network system performance values taught earlier, and these predicted values could be acquired within the model of the environment simultaneously by executing the prediction engine on two or more computers, which may be connected as parallel processing machines, or independent computing devices, or which may be predicted at different times by one or more computers each running one or more prediction engines. Alternatively, we contemplate prediction methods that allow multiple locations in the environmental model to be computed for and displayed simultaneously, and such predicted data and comparisons between data may be displayed using methods taught subsequently in this invention.

In addition to the above considerations, the present invention provides a means of displaying the differences between measured data and predicted data in a convenient manner which yields great insight into actual versus predicted performance of any communications network. Based on the above teaching, it should be clear that measured data and predicted data may be displayed in a 3-D environment, and may be overlaid upon each other in space, in order to provide a registration of measured and predicted values. In this manner, it is possible to compare measurement runs to prediction runs, so long as the measurements are collected at points which are contained in the same environment which is modeled by the prediction engine. Measurement points may be at the same locations as prediction points or comparisons may be made between measurement points which are close to prediction points as specified above. Also, simply plotting measurement and predicted points which are not co-located still allows easy 3D visualization of differences, for rapid comparisons. It is clear to one trained in data processing and error analysis how novel visualization techniques that apply to: a) measured data, b) the comparison of measured data, c) predicted data, and d) the comparison of predicted data could also be applied to the comparison of measured to predicted data. Using the novel visualization methods which are described subsequently to compare measured versus predicted values offers tremendous power for engineers who seek to develop and optimize and use prediction models that perform most accurately in particular physical environments.

Now consider a practical user of a wireless design system. If the designer wishes to use predicted performance data for the basis of comparisons, he or she selects the wireless communication system performance predictive model to utilize. The preferred embodiment uses a number of methods to predict and optimize performance in a wireless communication network. These include methods to incorporate and build upon performance prediction techniques such as those described in the previously cited and following technical reports and papers: "Interactive Coverage Region and System Design Simulation for Wireless Communication Systems in Multi-floored Indoor Environments: SMT Plus," IEEE ICUPC '96 Proceedings, by R. Skidmore, T. Rappaport, and A. L. Abbott, and "SitePlanner 3.16 for Windows 95/98/NT User's Manual", Wireless Valley Communications, Inc. 1999, all of which are hereby incorporated by reference. It would be apparent to one skilled in the art how to apply other wireless communication system performance models to this method.

When making comparisons using prediction data, several methods may be employed to visualize the results. As described in co-pending application Ser. No. 09/352,678, entitled "System for the Three-Dimensional Display of Wireless Communications System Performance", the present method may employ a grid of vertices placed over a region of any shape or size to cover the predicted area. At each vertex in the grid, the communications network performance is predicted, and the set of all performance predictions may be stored, logged, or displayed as described in patent application Ser. No. 09/352,678.

Other methods for generating a set of prediction comparison data may also be employed. As described in co-pending application Ser. No. 09/318,840, entitled "Method and System for Automated Optimization of Antenna Positioning in 3-D", the present invention can make use of one or more locations in the 3-D environment, termed "watch points", for making predictions. Using the aforementioned prediction models, the performance values at each watch point are calculated and then stored, logged, or displayed as described in patent application Ser. No. 09/318,840.

Other methods could be employed for generating prediction comparison data sets. It should be obvious to one of skill in the art that the novelty of the present invention will remain regardless of how the prediction data set is generated. The aforementioned methods for generating a data set are simply given as examples from the current embodiment.

Figure 10:
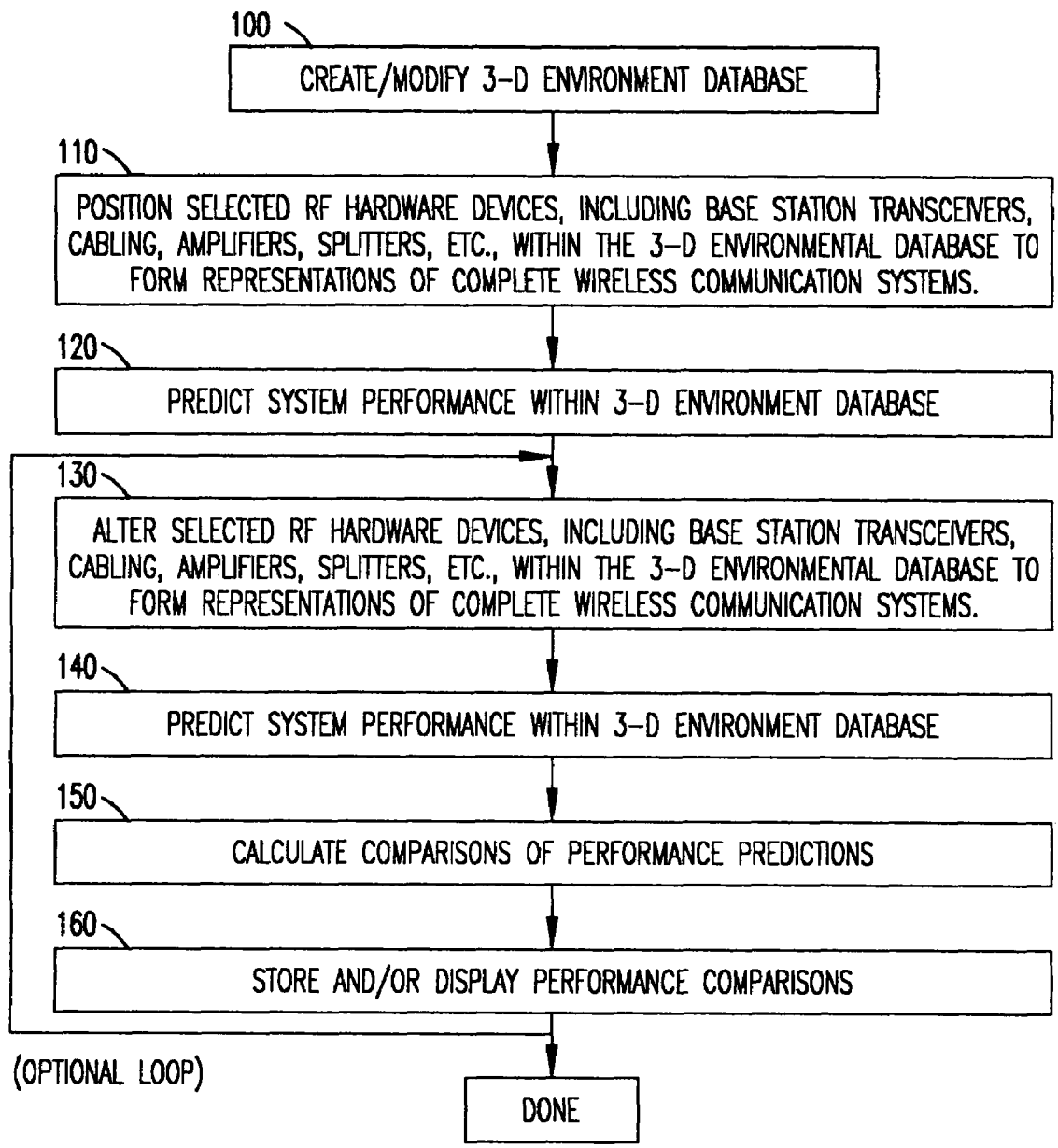
FIG. 10 shows a flow diagram describing a process for comparing performance prediction results.

Referring now to FIG. 10, there is shown a flow diagram according to the present invention for comparing prediction data. Having an environmental model 100 available for making predictions, a system of RF hardware devices 110 is positioned in the environmental model. An initial set of prediction data 120 is made using a selected prediction model. The communications system may be redesigned in block 130 by adding, removing, or replacing hardware RF components, or by changing the layout, orientation, or other electrical or mechanical parameters of the existing hardware RF components. A second prediction data set 140 is then obtained for the purposes of comparison with the initial prediction data. Because each prediction data set is stored on a computer, any two or more predictions may be compared with another in block 150 and those comparisons stored in block 160. The designer is free to recursively alter the communications system as necessary and compare how the changes impact predicted performance.

It should be obvious to one of skill in the art that, rather than comparing two communication systems separately, a comparison could be made between two or more communication systems existing at a single time in a physical environment. Existing prior art such as SitePlanner® from Wireless Valley Communications, Inc. are already capable of performing such calculations, and hence are not covered by the present invention. One of the novelties of the present invention is in comparing changes made to a communication systems and visualizing the changes in the form of a direct comparison.

None of the existing prior art is capable of displaying comparisons between measured and predicted data on top of a 3-D environmental model. Using the present invention, measurement data collected may be used as a performance data set for comparison. As described in co-pending application Ser. No. 09/221,985, entitled "System for Creating a Computer Model and Measurement Database of a Wireless Communication Network", measurement data may be collected from a variety of radio receivers attached to a computer running SitePlanner®.

Figure 11:
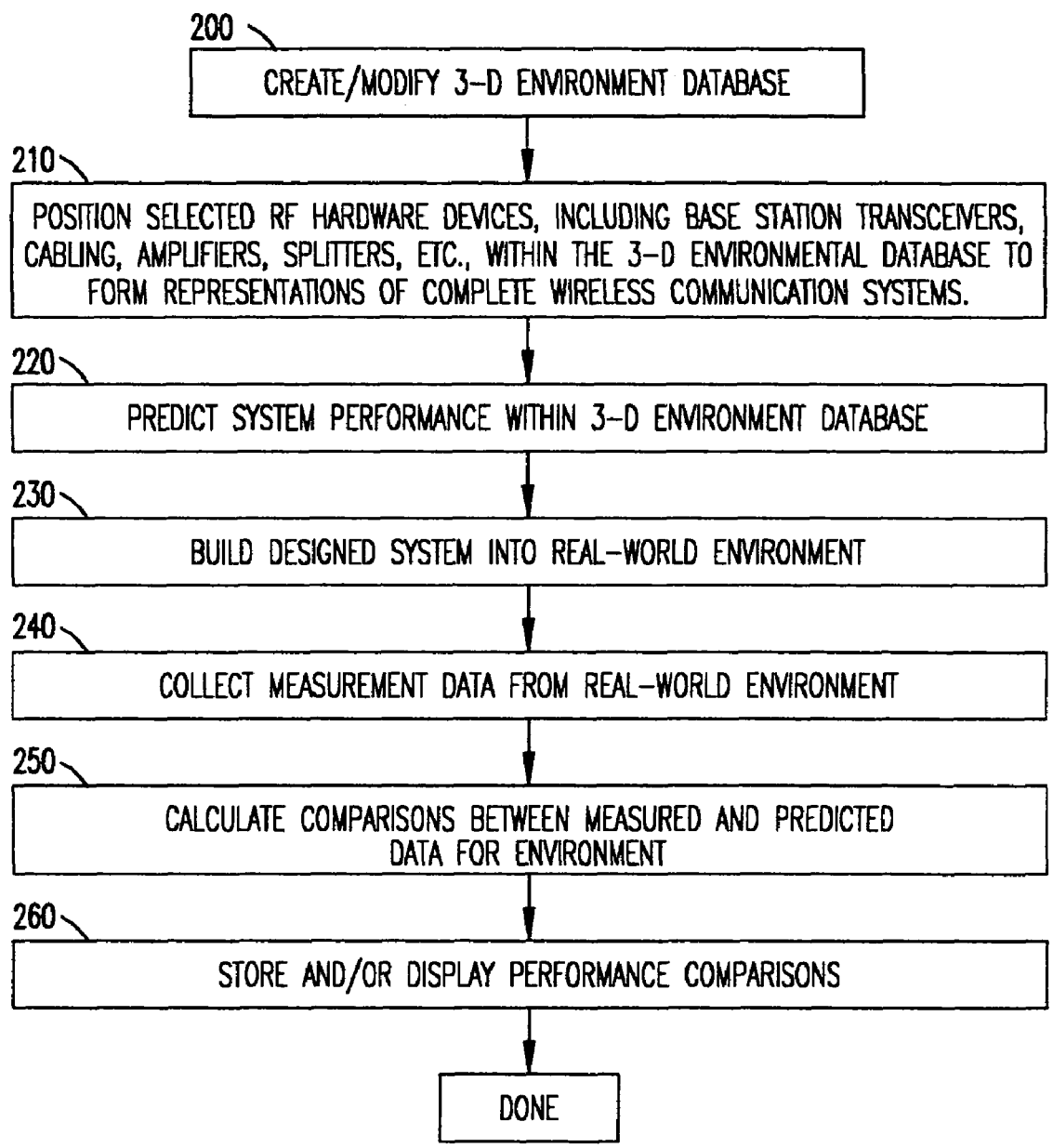
FIG. 11 shows a flow diagram describing a process for comparing performance predictions with measurement results.

Referring now to FIG. 11, a flow diagram is shown for comparing measured data with predicted data. Having an environmental model 200 available for making predictions, a system of RF hardware devices 210 is positioned in the environmental model. A set of prediction data 220 is made using a selected prediction model. The designed communication system is built into the real-world physical environment in function block 230, and measurement data is collected in 240 using an attached radio receiver. With available measurement data, a comparison is made between the predicted performance data set and the measurement data set in function block 250. The comparison data is displayed and/or stored as previously discussed in block 260.

Figure 12:
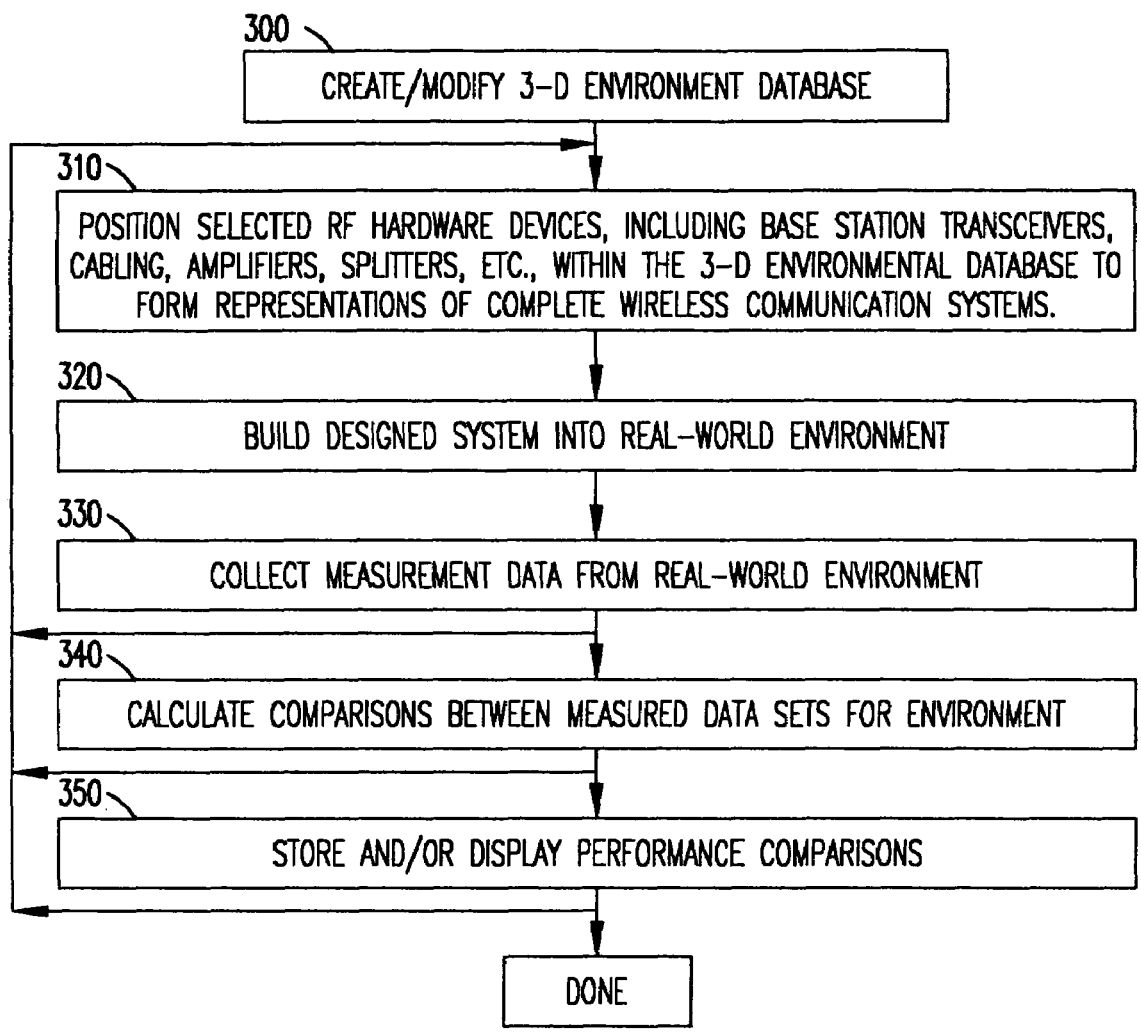
FIG. 12 shows a flow diagram describing a process for comparing multiple measurement performance runs.

FIG. 12 shows a flow diagram for comparing multiple measurement data sets with each other. Having an environmental model 300 available for making predictions, a system of RF hardware devices 310 is positioned in the environmental model. The designed communication system is built into the real-world physical environment in function block 320, and measurement data is collected in 330 using an attached radio receiver. The entire design, build-out, and measurement collection procedure may be repeated many times, and measurement data sets may be compared and stored and displayed repeatedly in blocks 340 and 350.

Figure 13:
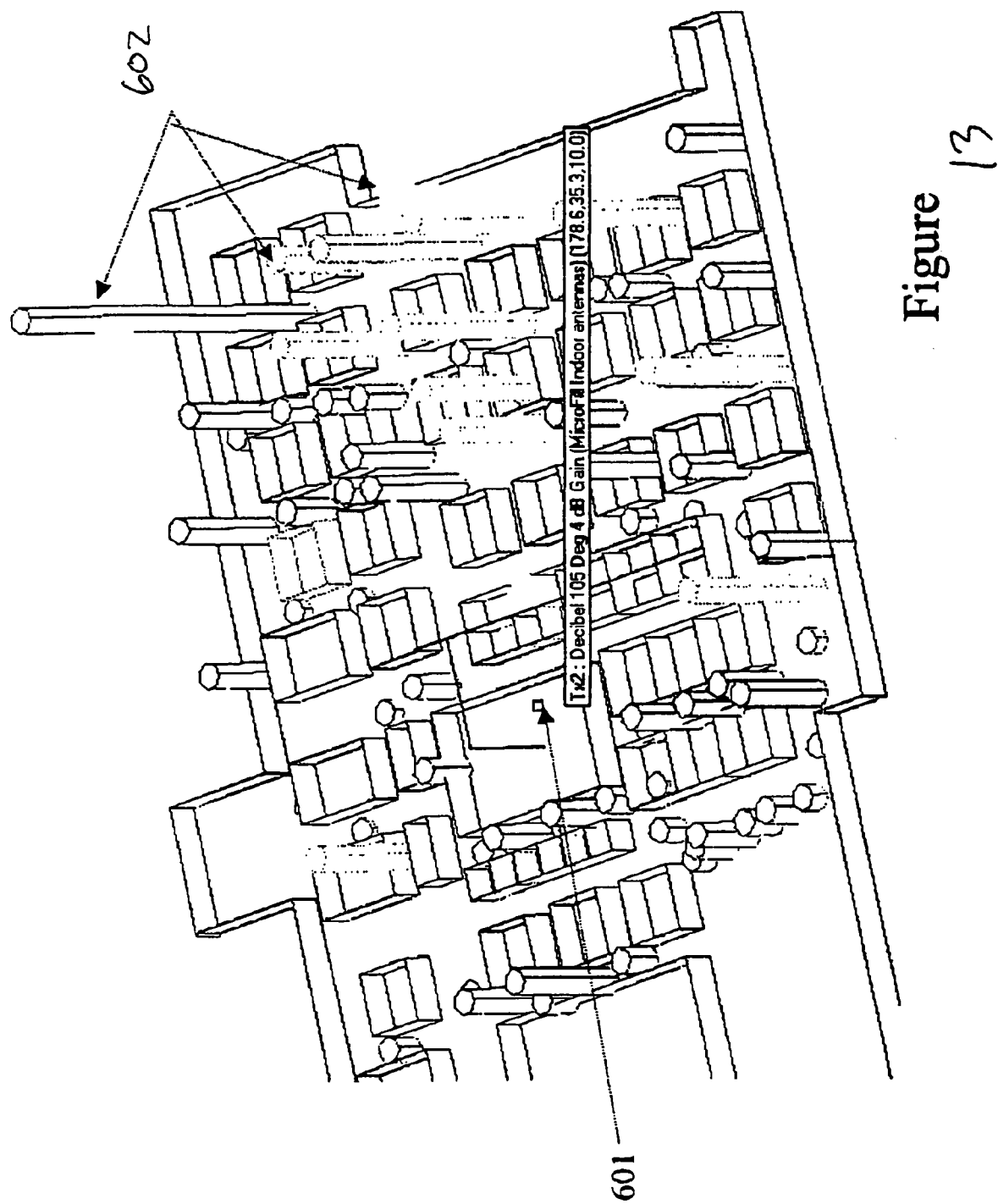
FIG. 13 shows a 3-D display of iconic representations for predicted performance data overlaying a 3-D physical environment.

Referring now to FIG. 13, the display of predicted performance metrics at each watch point can take the form of shaded colored cylindrical markers overlaid with the 3-D environmental model. In this form of presentation, both the height and color of the cylindrical graphical entities corresponds to the predicted performance metrics at that location in the 3-D environmental model. The designer has full control of both the range of colors and the range of heights that the cylindrical graphical entities can adopt. This form of presentation enables the designer to rapidly assess the performance of the wireless communication system by providing a much more dramatic display of the predicted results. In FIG. 13, as the designer moves the mouse or other computer pointing device cursor, an antenna component 601 is effectively relocated and/or reoriented within the 3-D environmental model. In real-time, the new predicted performance metrics given the new position and/or orientation of the antenna component are represented at each of the watch points 602 as three-dimensional shaded colored cylinders. One skilled in the art could see how the watch point graphical entities could easily assume the form of three-dimensional cones, pyramids, cubes, or any other three-dimensional graphical entity as well with similar results.

Figure 14:
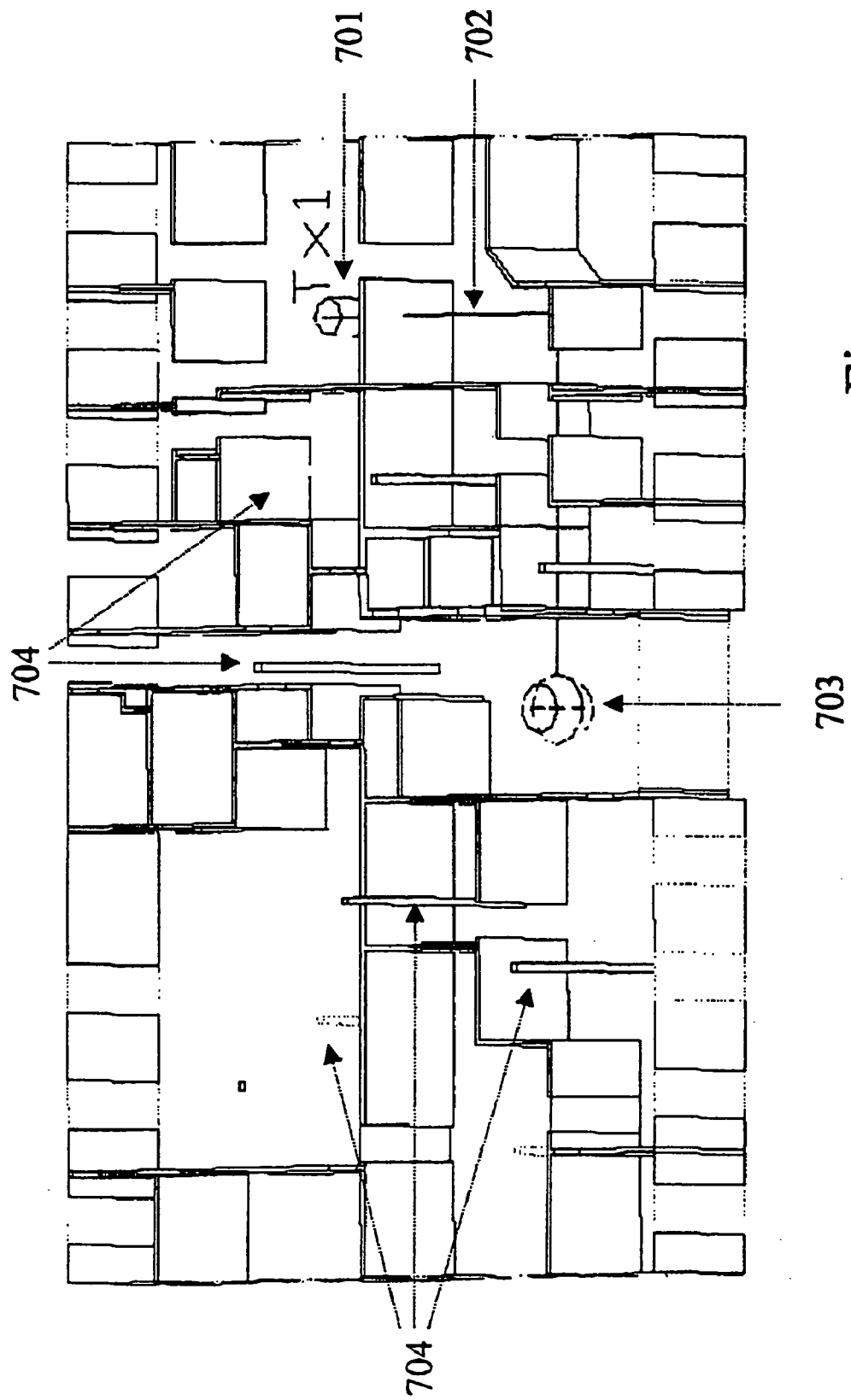
FIG. 14 shows a 3-D display of iconic representations for measurement data overlaying a 3-D physical environment.

Referring now to FIG. 14, the display of measured performance metrics at each watch point can take the form of shaded colored cylindrical markers overlaid with the 3-D environmental model. Similar to FIG. 13, both the height and color of the cylindrical graphical entities corresponds to the measured performance metrics at that location in the 3-D environmental model. The designer has full control of both the range of colors and the range of heights that the cylindrical graphical entities can adopt. This form of presentation enables the designer to rapidly assess the performance of the wireless communication system by providing a much more dramatic display of the measured results. For example, with the present invention, differences between measurement runs and/or prediction runs can be easily visualized in the 3-D environment, even if some or all of the individual data points to be compared are not co-located or interpolated to approximate co-location. By having a 3-D visualization where height, width, color, shape, thickness are easily discernible between data sets, the user can quickly and visually compare results. Furthermore, the vertical display nature of the 3-D watchpoints or a collection of watchpoints that form a grid of watchpoints appear to rise above the displayed physical environment. One skilled in the art could see how the watch point graphical entities could easily assume the form of three-dimensional cones, pyramids, cubes, or any other three-dimensional graphical entity as well with similar results.

While the invention has been described in terms of a single preferred embodiment, those skilled in the art will recognize that the invention can be practiced with modification within the spirit and scope of the appended claims. For example, this invention may not be limited just to wireless communication systems, but may be used to present any type of electromagnetic characteristics superimposed on any simulated three-dimensional environment. For example, the invention would find application in the next generation field of micromachines and nanomachines or micro-electrical-mechanical machines (MEMS). These machines are extremely small yet highly sophisticated functional elements that allow them to perform complicated tasks in hard-to-access locations, such as inside the human body, in plumbing, in jet engines, etc. It will be necessary to both wirelessly communicate with these machines as well as wirelessly provide power for these machines, such as in the form of RF pulses, infrared (IR) light or any other form of electromagnetic medium. The present invention would therefore facilitate the modeling and presentation of this or any other wireless electromagnetic system.

We claim:

1. A method for designing, deploying or optimizing a communications network, comprising the steps of:
   providing a computerized model which represents a physical environment in which a communications network is or will be installed, said computerized model providing a display of at least a portion of said physical environment;
   providing performance attributes for a plurality of system components which may be used in said physical environment;
   selecting specific components from said plurality of system components for use in said computerized model;
   representing said selected specific components in said display;
   selecting specific points within said display where performance data is desired;
   running prediction models using the computerized model and said performance attributes to predict performance characteristics of a communications network composed of said selected specific components, said prediction models providing predicted performance data for said selected specific points; and
   displaying results from said prediction models on said display at said selected specific points in the form of one or more icons.

2. The method of claim 1 wherein said display is three dimensional.

3. The method of claim 1 wherein said icon is three dimensional.

4. The method of claim 1 wherein both said display and said icons are three dimensional.

5. The method of claim 4 wherein said icon is depicted as a graphical cylinder where an attribute selected from the group consisting of height, radius, brightness, color, hue, saturation, line type and width, transparency, and surface texture varies depending on the performance data.

6. The method of claim 4 wherein said icon has an attribute selected from the group consisting of height, radius, brightness, color, hue, saturation, line type and width, transparency, and surface texture varies depending on the performance data.

7. An apparatus for designing, deploying or optimizing a communications network, comprising:
   a means for providing a computerized model which represents a physical environment in which a communications network is or will be installed, said computerized model providing a display of at least a portion of said physical environment;
   a means for providing performance attributes for a plurality of system components which may be used in said physical environment;
   a means for selecting specific components from said plurality of system components for use in said computerized model;
   a means for representing said selected specific components in said display;
   a means for selecting specific points within said display where performance data is desired;
   a means for running prediction models using the computerized model and said performance attributes to predict performance characteristics of a communications network composed of said selected specific components, said prediction models providing predicted performance data for said selected specific points; and
   a means for displaying results from said prediction models on said display at said selected specific points in the form of one or more icons.

8. The apparatus of claim 7 wherein said display is three dimensional.

9. The apparatus of claim 7 wherein said icon is three dimensional.

10. The apparatus of claim 7 wherein both said display and said icon is three dimensional.

11. The apparatus of claim 10 wherein said icon is depicted as a graphical cylinder where an attribute selected from the group consisting of height, radius, brightness, color, hue, saturation, line type and width, transparency, and surface texture varies depending on the performance data.

12. The apparatus of claim 10 wherein said icon has an attribute selected from the group consisting of height, radius, brightness, color, hue, saturation, line type and width, transparency, and surface texture varies depending on the performance data.

13. A method for designing, deploying or optimizing a communications network, comprising the steps of:
   providing a computerized model which represents a physical environment in which a communications network is or will be installed, said computerized model providing a display of at least a portion of said physical environment;
   providing performance attributes for a plurality of system components which may be used in said physical environment;
   selecting specific components from said plurality of system components for use in said computerized model;
   representing said selected specific components in said display;
   selecting specific points within said display where performance data is desired;
   running prediction models using the computerized model and said performance attributes to predict performance characteristics of a communications network composed of said selected specific components, said prediction models providing predicted performance data for said selected specific points;

measuring actual performance data for said physical environment; and comparing said actual performance data to said predicted performance data.

14. The method of claim 13 further comprising the step of displaying a comparative result from said comparing step as an icon on said display.

15. The method of claim 14 wherein said icon and said display are three dimensional.

16. The method of claim 15 wherein said icon is depicted as a graphical cylinder where an attribute selected from the group consisting of height, radius, brightness, color, hue, saturation, line type and width, transparency, and surface texture varies depending on the performance data.

17. The method of claim 15 said icon has an attribute selected from the group consisting of height, radius, brightness, color, hue, saturation, line type and width, transparency, and surface texture varies depending on the performance data.

18. A method for designing, deploying or optimizing a communications network, comprising the steps of:

providing a computerized model which represents a physical environment in which a communications network is or will be installed, said computerized model providing a display of at least a portion of said physical environment;

providing performance attributes for a plurality of system components which may be used in said physical environment;

selecting specific components from said plurality of system components for use in said computerized model;

representing said selected specific components in said display;

selecting specific points within said display where performance data is desired;

running at least two different prediction models using the computerized model and said performance attributes to predict performance characteristics of a communications network composed of said selected specific components, said prediction models providing at least two predicted performance data for said selected specific points; and comparing said at least two predicted performance data.

19. The method of claim 18 further comprising the step of displaying a comparative result from said comparing step as an icon on said display.

20. The method of claim 19 wherein said icon and said display are three dimensional.

21. The method of claim 20 wherein said icon is depicted as a graphical cylinder where an attribute selected from the group consisting of height, radius, brightness, color, hue, saturation, line type and width, transparency, and surface texture varies depending on the performance data.

22. The method of claim 20 wherein said icon has an attribute selected from the group consisting of height, radius, brightness, color, hue, saturation, line type and width, transparency, and surface texture varies depending on the performance data.

23. A method for designing, deploying or optimizing a communications network, comprising the steps of:

providing a computerized model which represents a physical environment in which a communications network is or will be installed, said computerized model providing a display of at least a portion of said physical environment;

providing performance attributes for a plurality of system components which may be used in said physical environment;

selecting specific components from said plurality of system components for use in said computerized model;

representing said selected specific components in said display;

selecting specific points within said display where performance data is desired;

running at least one predictive model using the computerized model and said performance attributes to predict performance characteristics of a communications network composed of said selected specific components, said step of running being performed at least two times where performance parameters in said predictive model have changed between said at least two times so as to provide at least two predicted performance data for said selected specific points; and comparing said at least two predicted performance data.

24. The method of claim 23 further comprising the step of displaying a comparative result from said comparing step as an icon on said display.

25. The method of claim 24 wherein said icon and said display are three dimensional.

26. The method of claim 25 wherein said icon is depicted as a graphical cylinder where an attribute selected from the group consisting of height, radius, brightness, color, hue, saturation, line type and width, transparency, and surface texture varies depending on the performance data.

27. The method of claim 25 wherein said icon has an attribute selected from the group consisting of height, radius, brightness, color, hue, saturation, line type and width, transparency, and surface texture varies depending on the performance data.

28. A method for designing, deploying or optimizing a communications network, comprising the steps of:

providing a computerized model which represents a physical environment in which a communications network is or will be installed, said computerized model providing a display of at least a portion of said physical environment;

providing performance attributes for a plurality of system components which may be used in said physical environment;

selecting specific components from said plurality of system components for use in said computerized model;

representing said selected specific components in said display; selecting specific points within said display where performance data is desired;

measuring actual performance data for said physical environment which correspond to said specific points, said measuring step being performed using different measurement devices, or being performed at different time periods such that at least two sets of measurement data are obtained; and comparing said at least two sets of measurement data.

29. The method of claim 28 further comprising the step of displaying a comparative result from said comparison step as an icon on said display.

30. The method of claim 29 wherein said icon and said display are three dimensional.

31. The method of claim 30 wherein said icon is depicted as a graphical cylinder where an attribute selected from the group consisting of height, radius, brightness, color, hue, saturation, line type and width, transparency, and surface texture varies depending on the performance data.

32. The method of claim 30 wherein said icon has an attribute selected from the group consisting of height, radius, brightness, color, hue, saturation, line type and width, transparency, and surface texture varies depending on the performance data.

* * * * *